US011841728B2

(12) United States Patent
Akahane et al.

(10) Patent No.: US 11,841,728 B2
(45) Date of Patent: Dec. 12, 2023

(54) INTEGRATED CIRCUIT AND SEMICONDUCTOR MODULE

(71) Applicant: FUJI ELECTRIC CO., LTD., Kawasaki (JP)

(72) Inventors: Masashi Akahane, Matsumoto (JP); Taizo Asano, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/751,115

(22) Filed: May 23, 2022

(65) Prior Publication Data

US 2023/0006656 A1    Jan. 5, 2023

(30) Foreign Application Priority Data

Jul. 2, 2021  (JP) ................................. 2021-110575
Jan. 21, 2022 (JP) ................................. 2022-007683

(51) Int. Cl.
*G05F 3/26* (2006.01)
*H03K 17/60* (2006.01)
*H03K 3/012* (2006.01)

(52) U.S. Cl.
CPC ............ *G05F 3/267* (2013.01); *H03K 3/012* (2013.01); *H03K 17/60* (2013.01)

(58) Field of Classification Search
CPC ..... G05F 3/02; G05F 3/10; G05F 3/16; G05F 3/20; G05F 3/26; G05F 3/267

USPC ................................. 323/281, 313, 314, 315
See application file for complete search history.

(56) References Cited

U.S. PATENT DOCUMENTS

| | | | | |
|---|---|---|---|---|
| 5,852,360 A | * | 12/1998 | Levinson ................ | G05F 3/245 323/317 |
| 6,362,612 B1 | * | 3/2002 | Harris ....................... | G05F 3/30 323/314 |
| 2005/0088163 A1 | * | 4/2005 | Tachibana ................. | G05F 3/30 323/313 |
| 2006/0176043 A1 | * | 8/2006 | Makino ..................... | G05F 3/30 323/312 |

FOREIGN PATENT DOCUMENTS

| | | |
|---|---|---|
| JP | 2000-075945 A | 3/2000 |
| JP | 2007-102753 A | 4/2007 |
| JP | 2012-174085 A | 9/2012 |
| JP | 2013-149197 A | 8/2013 |
| JP | 2018-088037 A | 6/2018 |

* cited by examiner

*Primary Examiner* — William Hernandez
(74) *Attorney, Agent, or Firm* — Rabin & Berdo, P.C.

(57) ABSTRACT

An integrated circuit, including: a first current source; a second current source provided in parallel to the first current source; a first resistor with one end coupled to an output of the first current source; a first bipolar transistor that is diode-connected and is coupled to the other end of the first resistor; a second bipolar transistor that is diode-connected and is coupled to an output of the second current source; a second resistor coupled to the second bipolar transistor; and an output circuit configured to output a voltage based on a first voltage outputted from the first current source and a second voltage outputted from the second current source.

17 Claims, 13 Drawing Sheets

INTEGRATED CIRCUIT AND SEMICONDUCTOR MODULE

CROSS-REFERENCE TO RELATED APPLICATION

The present application claims priority pursuant to 35 U.S.C. § 119 from Japanese patent application numbers 2021-110575 and 2022-007683, filed on Jul. 2, 2021 and Jan. 21, 2022, respectively, the entire disclosure of each of which is hereby incorporated by reference herein.

BACKGROUND

Technical Field

The present disclosure relates to an integrated circuit and a semiconductor module.

Description of the Related Art

A voltage reference circuit using a semiconductor bandgap voltage is known (see Japanese Patent Laid-open Publication No. 2007-102753, for example).

In a bandgap-type voltage reference circuit including a bipolar transistor, when the bipolar transistor is exposed to high temperatures, leakage current may occur between the N-well region covering the collector terminal and the substrate. This increases the current outputted through the substrate of the voltage reference circuit, so that the voltage outputted from the voltage reference circuit may fail to have a desired temperature characteristic.

SUMMARY

A first aspect of an embodiment of the present disclosure is an integrated circuit, comprising: a first current source having an output configured to output a first voltage; a second current source provided in parallel to the first current source and having an output configured to output a second voltage; a first resistor having two ends, one end thereof being coupled to the output of the first current source; a first bipolar transistor which is diode-connected and is coupled to the other end of the first resistor; a second bipolar transistor which is diode-connected and is coupled to the output of the second current source; a second resistor coupled to the second bipolar transistor; and an output circuit configured to output a third voltage based on the first voltage outputted from the first current source and the second voltage outputted from the second current source.

A second aspect of an embodiment of the present disclosure is an integrated circuit, comprising: a first current source having an output configured to output a first voltage; a second current source provided in parallel to the first current source and having an output configured to output a second voltage; a first resistor having two ends, one end thereof being coupled to the output of the first current source; at least one first bipolar transistor that is diode-connected and is coupled to the other end of the first resistor; a plurality of first trimming devices coupled to the output of the second current source; a plurality of second bipolar transistors which are each diode-connected and are respectively coupled to the plurality of first trimming devices; a second resistor having two ends, one end thereof being coupled to the plurality of second bipolar transistors; and an output circuit configured to output a third voltage based on the first voltage outputted from the first current source and the second voltage outputted from the second current source.

A third aspect of an embodiment of the present disclosure is a semiconductor module, comprising: the integrated circuit according to claim 1; and a switching device having a control electrode, wherein the integrated circuit further includes a control circuit that is coupled to the control electrode of the switching device, and that controls driving of the switching device based on an input signal of the control circuit and the third voltage.

The aforementioned summary of the invention does not include all necessary characteristics of the invention. The sub-combinations of those characteristics are also included in the invention.

BRIEF DESCRIPTION OF THE DRAWINGS

FIG. 2 is an example circuit diagram of a voltage generation circuit 41a.

FIG. 4 is an example schematic diagram illustrating changes in current and voltage with temperature in a voltage reference circuit 52a.

FIG. 7 is an example schematic diagram illustrating changes in current and voltage with temperature in the voltage generation circuit 101a.

DETAILED DESCRIPTION

Hereinafter, the invention is described through embodiments, but the following embodiments will not limit the invention according to the claims. In addition, all the combinations of the characteristics described in the embodiments are not essential for solving means of the invention.

In the specification, the term "to couple" means "to electrically couple" except where specifically noted.

Embodiments

Configuration Example of Semiconductor Module 10

Figure 1:
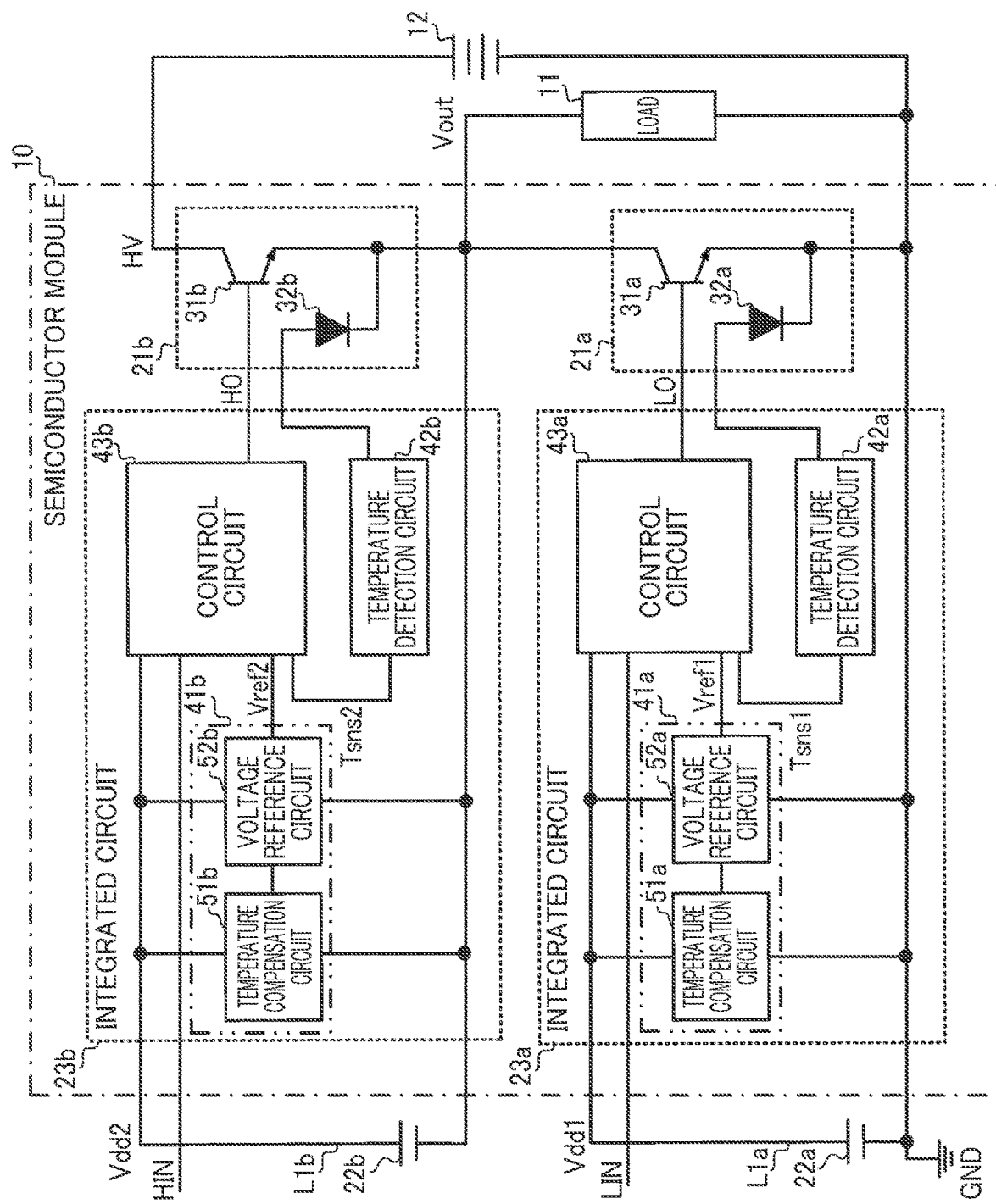
FIG. 1 illustrates an example configuration of a semiconductor module 10.

FIG. 1 illustrates an example configuration of a semiconductor module 10. The semiconductor module 10 is a module to drive a load 11 under an instruction from a microcomputer (not illustrated) externally provided.

The semiconductor module 10 uses a power supply 12 supplying a voltage HV as a main power supply used in power conversion to the load 11. The semiconductor module 10 includes semiconductor chips 21a and 21b, power supplies 22a and 22b, and integrated circuits 23a and 23b.

The semiconductor module 10 of the first embodiment is an intelligent power module (IPM) composed of a package of the semiconductor chips 21a and 21b and the integrated circuits 23a and 23b having a driving function and various protection functions for the circuits of the semiconductor chips 21a and 21b.

In the chips and other components constituting the semiconductor modules 10, the semiconductor chip 21a, power supply 22a, and integrated circuit 23a are provided in the low side while the semiconductor chip 21b, power supply 22b, and integrated circuit 23b are provided in the high side. In the first embodiment, the circuits in the low and high sides have the same configuration, and the circuits in the low side are mainly described below.

The load 11 is, for example, a motor coil and is driven with a voltage Vout outputted from the node of the contact provided between the semiconductor chips 21a and 21b.

The semiconductor chip 21a includes a switching device to drive the load 11 and a temperature detection device.

The semiconductor chip 21a of the first embodiment includes an insulated gate bipolar transistor (IGBT) 31a as the switching device and a diode 32a for the IGBT 31a as the temperature detection device.

The switching device provided for the semiconductor chips 21a is not limited to the IGBT 31a and may be a MOS transistor or a bipolar transistor. The semiconductor chip 21a may include a diode for commutation of load current, such as a freewheeling diode (FWD), other than the diode 32a.

The power supply 22a is a power supply for the integrated circuit 23a and applies a power supply voltage Vdd1 to a power supply line L1a. The power supply 22a of the first embodiment is provided outside of the semiconductor module 10. Alternatively, the voltage to be supplied to the integrated circuit 23a may be generated by a power supply circuit (not illustrated) provided within the semiconductor module 10.

The integrated circuit 23a is a low voltage integrated circuit (LVIC). The integrated circuit 23a is a circuit configured to output a driving signal LO to the gate electrode of the IGBT 31a based on a signal LIN inputted from a microcomputer (not illustrated) to control the IGBT 31a. The integrated circuit 23a includes a voltage generation circuit 41a, a temperature detection circuit 42a, and a control circuit 43a.

The voltage generation circuit 41a of the first embodiment is a circuit configured to generate a reference voltage Vref1 based on the power supply voltage Vdd1 of the power supply line L1a. The voltage generation circuit 41a includes a temperature compensation circuit 51a and a voltage reference circuit 52a.

The temperature compensation circuit 51a of the first embodiment is a circuit including bipolar devices. In the bipolar devices, as described later, leakage current toward the ground occurs in a temperature range not lower than a predetermined temperature.

At temperatures lower than the predetermined temperature, the temperature compensation circuit 51a supplies a constant voltage to the voltage reference circuit 52a. At temperatures not lower than the predetermined temperature, the temperature compensation circuit 51a supplies voltage that decreases with temperature.

In the temperature compensation circuit 51a and voltage reference circuit 52a, as described later, when leakage current occurs in the bipolar devices included in the temperature compensation circuit 51a, the voltage supplied from the temperature compensation circuit 51a to the voltage reference circuit 52a decreases.

The temperature compensation circuit 51a is coupled to the power supply line L1a. When supplied with voltage from the power supply 22a, the temperature compensation circuit 51a supplies temperature-compensated voltage and current to the voltage reference circuit 52a.

The voltage reference circuit 52a supplies the reference voltage Vref1 to the control circuit 43a based on the power supply voltage Vdd1 supplied from the power supply line L1a and the voltage and current supplied from the temperature compensation circuit 51a.

The temperature detection circuit 42a supplies a predetermined current to the diode 32a and outputs to the control circuit 43a, a temperature sense signal Tsns1 corresponding to the temperature of the IGBT 31a based on a forward voltage of the diode 32a.

The control circuit 43a controls the operation of the IGBT 31a based on the signal LIN inputted from the microcomputer (not illustrated), reference voltage Vref1, and temperature sense Tsns1.

The control circuit 43a is coupled to a control electrode of the switching device of the semiconductor chip 21a.

Specifically, if the switching device is the IGBT 31a like the first embodiment, the control circuit 43a is coupled to the gate electrode. Similarly, if the switching device is a MOS transistor, the control circuit 43a is coupled to the gate electrode thereof, and if the switching device is a bipolar transistor, the control circuit 43a is coupled to the base electrode thereof.

Specifically, the control circuit 43a outputs the driving signal LO based on the signal LIN to control drive of the IGBT 31a. The control circuit 43a also detects overheat of the semiconductor chip 21a based on the reference voltage Vref1 and the temperature sense signal Tsns1. Upon detecting overheat of the semiconductor chip 21a, for example, the control circuit 43a turns off the IGBT 31a to protect the IGBT 31a from heat.

As the corresponding configurations in the high side, the semiconductor chip 21b includes an IGBT 31b and a diode 32b, and the power supply 22b applies a power supply voltage Vdd2 to a power supply line L1b. The integrated circuit 23b includes a voltage generation circuit 41b, a temperature detection circuit 42b, and a control circuit 43b.

The voltage generation circuit 41b, similarly to the voltage generation circuit 41a, supplies a reference voltage Vref2 to the control circuit 43b. The temperature detection circuit 42b, similarly to the temperature detection circuit 42a, outputs to the control circuit 43b, a temperature sense signal Tsns2 corresponding to the temperature of the IGBT 31b based on a forward voltage of the diode 32b.

The control circuit 43b controls the operation of the IGBT 31b based on a signal HIN from a microcomputer (not illustrated), the reference voltage Vref2, and the temperature sense signal Tsns2. The control circuit 43b includes a level shifter circuit (not illustrated) configured to translate the signal HIN with the reference voltage being GND to a signal with the reference voltage being Vout.

As described above, the voltage generation circuit 41b and temperature detection circuit 42b include the same functions and configurations as those of the voltage generation circuit 41a and temperature detection circuit 42a, respectively. The description of the integrated circuit 23b in the high side, which includes the voltage generation circuit 41b, temperature detection circuit 42b, and control circuit 43b, is omitted.

The reference Vref1 corresponds to a "third voltage". The control circuit 43b corresponds to a "second control circuit". The voltage reference circuit 52a outputting the reference voltage Vref1 is described in detail later.

===Configuration of Voltage Generation Circuit 41a===

Figure 2:
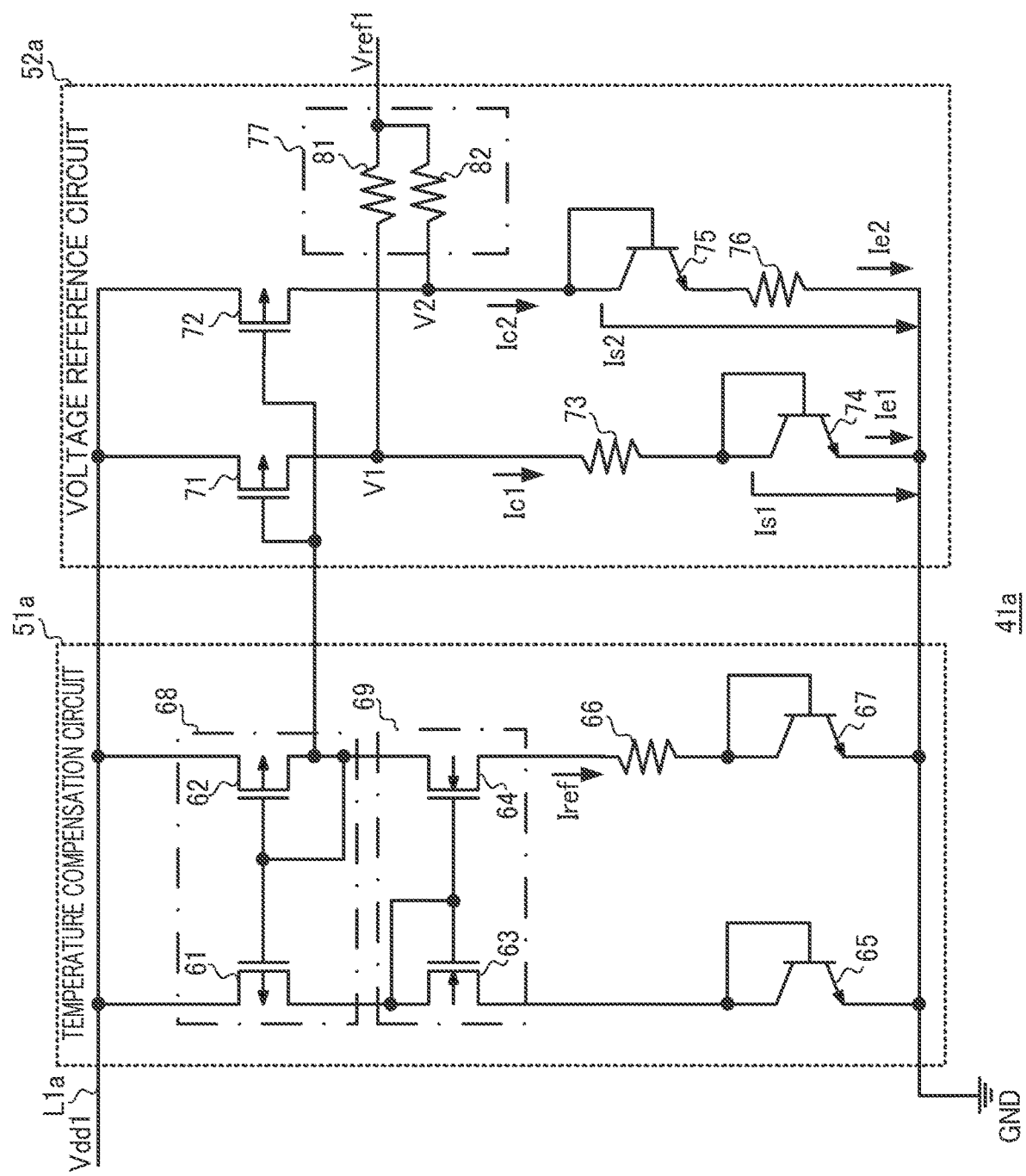

FIG. 2 is an example circuit diagram of the voltage generation circuit 41a, illustrating the configurations of the temperature compensation circuit 51a and voltage reference circuit 52a included in the voltage generation circuit 41a.

The temperature compensation circuit 51a includes MOS transistors 61 to 64, bipolar transistors 65 and 67, and a resistor 66. The MOS transistors 61 and 62 are P-MOS transistors, and the MOS transistors 63 and 64 are N-MOS transistors.

The voltage reference circuit 52a includes MOS transistors 71 and 72, resistors 73 and 76, bipolar transistors 74 and 75, and an output circuit 77. The MOS transistors 71 and 72 are P-MOS transistors.

<<Configuration of Temperature Compensation Circuit 51a>>

The MOS transistors 62 and 63 are diode-connected transistors with the gate and drain electrodes coupled to each other. The MOS transistors 61 and 62 constitute a P-channel current mirror circuit 68 while the MOS transistors 63 and 64 constitute an N-channel current mirror circuit 69.

When the diode-connected MOS transistor 62 is supplied with the voltage Vdd1 and current from the power supply line L1a, the MOS transistor 61 is turned on. The MOS transistor 61 outputs a current based on the current flowing through the MOS transistor 62. The MOS transistors 61 and 62 supply the currents to the MOS transistors 63 and 64, respectively.

In the first embodiment, the drain electrode of the MOS transistor 62 is coupled to the MOS transistor 64 and is coupled to the gate electrodes of the MOS transistors 71 and 72 in parallel. The MOS transistor 62 and MOS transistors 71 and 72 constitute a current mirror circuit.

If no leakage current occurs at the gate electrodes of the MOS transistors 71 and 72, steady current from the MOS transistor 62 to the MOS transistors 71 and 72 is substantially negligible. The currents supplied from the power supply line L1a to the MOS transistors 61 and 62 are therefore directly supplied to the MOS transistors 63 and 64, respectively.

When the diode-connected MOS transistor 63 is supplied with the current from the MOS transistor 61 of the current mirror circuit 68, the MOS transistor 64 is turned on. The MOS transistor 64 outputs a current depending on the current flowing through the MOS transistor 63. The MOS transistor 63 supplies the current to the bipolar transistor 65 while the MOS transistor 64 supplies the current to the resistor 66.

In the first embodiment, the MOS transistors 61 and 62 are of the same size, and the MOS transistors 63 and 64 are of the same size. The currents outputted from the MOS transistors 63 and 64 of the current mirror circuit 69 are equal to each other.

The base electrode of the bipolar transistor 65 is coupled to the collector electrode thereof. In this case, the base and collector electrodes of the bipolar transistor 65 are coupled to the source electrode of the MOS transistor 63, which is an output end of the current mirror circuit 69. On the other hand, the emitter electrode of the bipolar transistor 65 is grounded.

One end of the resistor 66 is coupled to the source electrode of the MOS transistor 64, which is the other output end of the current mirror circuit 69. On the other hand, the other end of the resistor 66 is coupled to the base and collector electrodes of the bipolar transistor 67.

Similar to the bipolar transistor 65, the base electrode of the bipolar transistor 67 is coupled to the collector electrode thereof, and the emitter electrode of the bipolar transistor 67 is grounded.

The bipolar transistors 65 and 67 are configured to differ in base-emitter voltage. Specifically, the bipolar transistor 65 of the first embodiment is composed of a single bipolar transistor while the bipolar transistor 67 is composed of a plurality of bipolar transistors coupled in parallel. The base-emitter voltage of the bipolar transistor 65 is greater than that of the bipolar transistor 67. The base-emitter voltages of the bipolar transistors 65 and 67 have both positive temperature coefficients.

In the first embodiment, since the currents from the current mirror circuits 68 and 69 are equal to each other, voltages generated at the source electrodes of the MOS transistors 63 and 64 are equal to each other. The voltage generated across the resistor 66 depends on the difference in base-emitter voltage between the bipolar transistors 65 and 67 and has a negative temperature coefficient.

The voltage generated at the node coupled to the MOS transistor 64 and resistor 66 is the sum of the base-emitter voltage of the bipolar transistor 67 having a positive temperature coefficient and the voltage across the resistor 66 having a negative temperature coefficient. In the first embodiment, the temperature coefficient of the voltage at the node coupled to the MOS transistor 64 and resistor 66 is set to zero by, for example, adjusting the resistance value of the resistor 66 or the number of bipolar transistors included in the bipolar transistor 67.

Herein, the bipolar transistor 67 conducts a current Iref. In the first embodiment, as the current Iref flowing through the bipolar transistor 67 increases, the voltage supplied from the MOS transistor 62 to the gate electrodes of the MOS transistors 71 and 72 decreases.

As later described with reference to FIGS. 3 and 4, when the bipolar transistors 65 and 67 are exposed to temperatures not lower than a predetermined temperature threshold Tth, leakage currents occur in the bipolar transistors 65 and 67, and the current flowing through the bipolar transistor 65 and the current Iref flowing through the bipolar transistor 67 increase.

The currents flowing through the bipolar transistors 65 and 67 are currents supplied from the current mirror circuits 68 and 69 to the bipolar transistors 65 and 67. Occurrence of leakage currents therefore increases currents flowing through the current mirror circuits 68 and 69.

The MOS transistors 61 and 62 constituting the current mirror circuit 68 are P-MOS transistors. When the currents flowing through the current mirror circuit 68 increase, therefore, the source-drain currents of the P-MOS transistors 61 and 62 increase, and the gate voltages of the MOS transistors 61 and 62 decrease.

In this case, the gate electrode of the MOS transistor 62 is coupled to the gate electrodes of the MOS transistors 71 and in parallel. The decrease in gate voltage of the MOS transistor 62 leads to a decrease in voltage applied to the gate electrodes of the MOS transistors 71 and 72 from the temperature compensation circuit 51a.

The MOS transistor 62 thus applies a voltage corresponding to a reference current to the MOS transistors 71 and 72 where the reference current is the reference current Iref flowing through the bipolar transistor 67.

The current mirror circuit 68 corresponds to a "first current mirror circuit". The current mirror circuit 69 corresponds to a "second current mirror circuit".

The resistor 66 corresponds to a "fifth resistor". The bipolar transistor 65 corresponds to a "fourth bipolar transistor", and the bipolar transistor 67 corresponds to a "third bipolar transistor". The current Iref flowing through the bipolar transistor 67 corresponds to a "reference current". The bipolar transistors with the base and collector electrodes coupled correspond to diode-connected bipolar transistors.

<<Configuration of Voltage Reference Circuit 52a>>

The source electrodes of the MOS transistors 71 and 72 are coupled to the power supply line L1a in parallel. The same voltage is applied to the source electrodes of the MOS transistors 71 and 72 from the power supply line L1a.

On the other hand, the gate electrodes of the MOS transistors 71 and 72 are coupled to the gate electrode of the MOS transistor 62. The MOS transistors 71 and 72 constitute a current mirror circuit in conjunction with the MOS transistor 62. To the gate electrodes of the MOS transistors 71 and 72, certain voltage is applied from the temperature compensation circuit 51a. Each of the MOS transistors 71 and 72 serves as a current source to supply a current to a device coupled to the drain electrode thereof.

Furthermore, the MOS transistors 71 and 72 of the first embodiment are of the same size. The currents supplied from the drain electrodes of the MOS transistors 71 and 72 are therefore equal to each other.

One end of the resistor 73 is coupled to the drain electrode of the MOS transistor 71. The other end of the resistor 73 is coupled to the collector electrode of the bipolar transistor 74. A current Ic1 supplied from the MOS transistor 71 to the resistor 73 flows through the resistor 73 to be supplied to the bipolar transistor 74.

The current Ic1 from the resistor 73 flows into the bipolar transistor 74. The bipolar transistor 74 is diode-connected with the collector and base electrodes coupled to each other. That is, the current Ic1 is a current flowing from the collector electrode side into the collector and base electrodes of the bipolar transistor 74.

As later described with reference to FIG. 3, the P− base region of the bipolar transistor 74 is grounded. In the bipolar transistor 74, a leakage current Is1 flowing from the substrate toward the ground without flowing through the emitter electrode occurs at temperatures not lower than a predetermined temperature.

The current Ic1 is expressed as the sum of a current Ie1 flowing out through the emitter electrode of the bipolar transistor 74 and the leakage current Is1 flowing out through the substrate as: Ic1=Ie1+Is1.

Since the current Ic1 flows through the resistor 73, a voltage V1 supplied from the drain electrode of the MOS transistor 71 is expressed by the formula: V1=(Ie1+Is1)×(the resistance value of the resistor 73)+(the voltage drop across the bipolar transistor 74). The voltage V1 therefore increases with the leakage current Is1.

On the other hand, a current Ic2 is supplied from the MOS transistor 72 to the diode-connected bipolar transistor 75 with the base and collector electrodes coupled to each other. That is, the current Ic2 is a current flowing into the collector and base electrodes of the bipolar transistor 75. The bipolar transistor 75 is coupled to the drain electrode of the MOS transistor 72.

In the bipolar transistor 75, similarly to the bipolar transistor 74, a leakage current Is2 flowing through the substrate toward the ground without flowing through the emitter electrode occurs at temperatures not lower than the predetermined temperature. As the leakage current Is2 increases, the current Ie2 flowing out through the emitter electrode of the bipolar transistor 75 decreases.

One end of the resistor 76 is coupled to the emitter electrode of the bipolar transistor 75 while the other end is grounded. In this case, the voltage drop across the resistor 76 is expressed as: (the resistance value of the resistor 76)×Ie2. In the first embodiment, the resistance value of the resistor 76 is set equal to the resistance value of the resistor 73.

A voltage V2 supplied from the MOS transistor 72 satisfies the formula: V2=(the resistance value of the resistor 76)×Ie2+(the voltage drop across the bipolar transistor 75). The current Ie2 decreases as the leakage current Is2 increases, and the voltage V2 accordingly decreases as the leakage current Is2 increases.

The currents Ic1 and Ic2 supplied from the MOS transistors 71 and 72 increase with temperature when the bipolar transistor 67 is in the temperature range not lower than the temperature threshold Tth.

Depending on the current Iref flowing through the bipolar transistor 67, the current flowing between the source and drain electrodes of the P-MOS transistor 62 increases, and the gate voltage of the MOS transistor 62 decreases.

The MOS transistors 71 and 72 constitute a current mirror circuit in conjunction with the MOS transistor 62. As the gate voltage of the MOS transistor 62 decreases, therefore, the gate voltages of the P-MOS transistors 71 and 72 decrease. The currents Ic1 and Ic2 respectively flowing between the source and drain electrodes of the MOS transistors 71 and 72 therefore increase.

In the first embodiment, when the current Iref flowing through the bipolar transistor 67 is the reference current, the MOS transistors 71 and 72 serve as current sources respectively generating the currents Ic1 and Ic2 to be supplied from the drain electrodes thereof.

The output circuit 77 outputs the reference voltage Vref1 based on the voltages V1 and V2 supplied from the MOS transistors 71 and 72 serving as the current sources.

In the first embodiment, the output circuit 77 includes resistors 81 and 82. The output circuit 77 of the first embodiment is a voltage divider circuit composed of the resistor 81 coupled to the node at which the voltage V1 is generated and the resistor 82 coupled to the node at which the voltage V2 is generated. In the first embodiment, the resistance values of the resistors 81 and 82 are set equal to each other.

One end of the resistor 81 is coupled to the drain electrode of the MOS transistor 71 serving as the current source. One end of the resistor 82 is coupled to the drain electrode of the MOS transistor 72 serving as the current source.

The other end of the resistor 82 is coupled to the different side of the resistor 81 from the side coupled to the drain electrode of the MOS transistor 71. In this case, the output circuit 77 outputs the voltage generated at the node coupling the resistors 81 and 82 as the reference voltage Vref1.

In another embodiment, for example, the output circuit 77 may be an adder circuit including an op-amp and adds up the voltages V1 and V2 to output the result as the reference voltage Vref1. In this case, the output circuit 77 is a non-inverting adder circuit.

The non-inverting adder circuit including an op-amp is configured as follows, for example. A so-called non-inverting amplifier circuit is formed, in which the inverting input terminal and output terminal of the op-amp are coupled to each other with a resistor therebetween and the inverting terminal is grounded through another resistor. The non-inverting input terminal of the op-amp in the non-inverting amplifier circuit is coupled to the resistors 81 and 82 in parallel.

The output circuit 77 may be an inverting adder circuit including an inverting amplifier circuit with the non-inverting input terminal coupled to the resistors 81 and 82 in parallel. Alternatively, the output circuit 77 may be a non-inverting adder circuit in which an inverting amplifier circuit is coupled to an inverting adder circuit.

In the first embodiment where the output circuit 77 in FIG. 2 is a voltage divider circuit, voltage division of the voltages V1 and V2 can be implemented using only the two resistors 81 and 82 without using a device such as an op-amp. The voltage reference circuit 52a of the first embodiment can output the reference voltage Vref1 as a combination of the voltages V1 and V2 weighted as desired through the resistance values of the resistors 81 and 82, with a circuit including fewer components and occupying a smaller area.

The MOS transistor 71 serves as a "first current source" and corresponds to a "first MOS transistor". The MOS transistor 72 serves as a "second current source" and corresponds to a "second MOS transistor". The voltage V1 corresponds to a "first voltage", and the voltage V2 corresponds to a "second voltage".

The resistor 73 corresponds to a "first resistor", and the bipolar transistor 74 corresponds to a "first bipolar transistor". The bipolar transistor 75 corresponds to a "second bipolar transistor", and the resistor 76 corresponds to a "second resistor". The resistors 81 and 82 correspond to a "third resistor" and a "fourth resistor", respectively.

===Occurrence Mechanism of Leakage Current Is===

Figure 3:
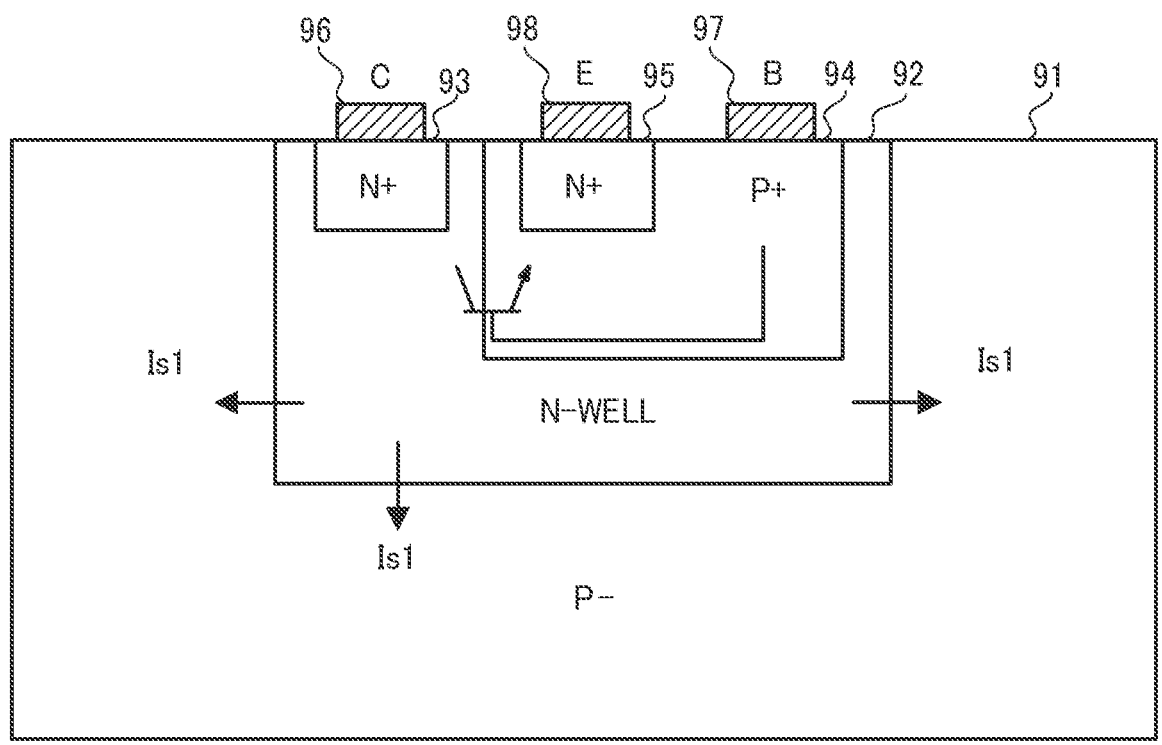
FIG. 3 is an example conceptual diagram illustrating occurrence of a leakage current Is1 in a bipolar transistor 74.

FIG. 3 is an example conceptual diagram illustrating occurrence of the leakage Is1 in the bipolar transistor 74 of the voltage reference circuit 52a. In the first embodiment, the bipolar transistor 74 is formed within a semiconductor by providing an N-well region 92 in a substrate 91 and providing dopant-diffused regions for operations of the respective terminals in the N-well region 92. In the first embodiment, the substrate 91 is of P− conductive type.

Within the N-well region 92, an N+ collector region 93 is provided around a region where a collector terminal 96 is provided. A P+ base region 94 is provided around a region where a base terminal 97 is provided. Within the P+ base region 94, an N+ emitter region 95 is provided around a region where an emitter terminal 98 is provided.

For the regions denoted with conductive types in FIG. 3, symbol "+" indicates that the doping concentration in the regions with "+" is higher than that in regions without "+". The symbol "−" indicates that the doping concentration in the region with "−" is lower than that in regions without "−".

In the thus-structured bipolar transistor 74, the surface area of the PN junction between the substrate 91 and N-well region 92 is larger than that of MOS transistors. When the semiconductor device is exposed to high temperatures, the larger the surface area of the PN junction, the more likely the leakage current Is1 is to occur.

The mechanism that causes the leakage current Is1 of the bipolar device in the voltage reference circuit 52a is described above using the bipolar transistor 74 as an example. The same mechanism can cause the leakage current Is2 in the bipolar transistor 75.

The magnitudes of the leakage currents Is1 and Is2 of the bipolar transistors 74 and 75 depend on the surface area of the PN junction inside. In the bipolar transistors 74 and 75, the leakage currents Is1 and Is2 can be adjusted to the same magnitude by equalizing the current supplied to the bipolar transistors 74 and 75, the number of parallel bipolar transistors constituting the bipolar transistors 74 and 75, and the surface area of the PN junction in the bipolar transistors 74 and 75.

In the first embodiment, the bipolar transistors 74 and 75 are of the same size. In the first embodiment, furthermore, the currents supplied from the drain electrodes of the MOS transistors 71 and 72 are equal to each other. The leakage currents Is1 and Is2 occurring in the bipolar transistors 74 and 75 are therefore adjusted to the same magnitude.

In the first embodiment, the "bipolar transistors 74 and 75 are of the same size" means that the number of parallel bipolar transistors constituting each of the bipolar transistors 74 and 75 is also adjusted so as to equalize the entire size of the bipolar transistors 74 and 75.

As described above, the "leakage current" in the first embodiment is a current flowing from the N-well region 92 to the substrate 91 in a bipolar transistor, for example.

===Temperature Characteristic of Voltage and Current in Voltage Reference Circuit 52a===

Figure 4:
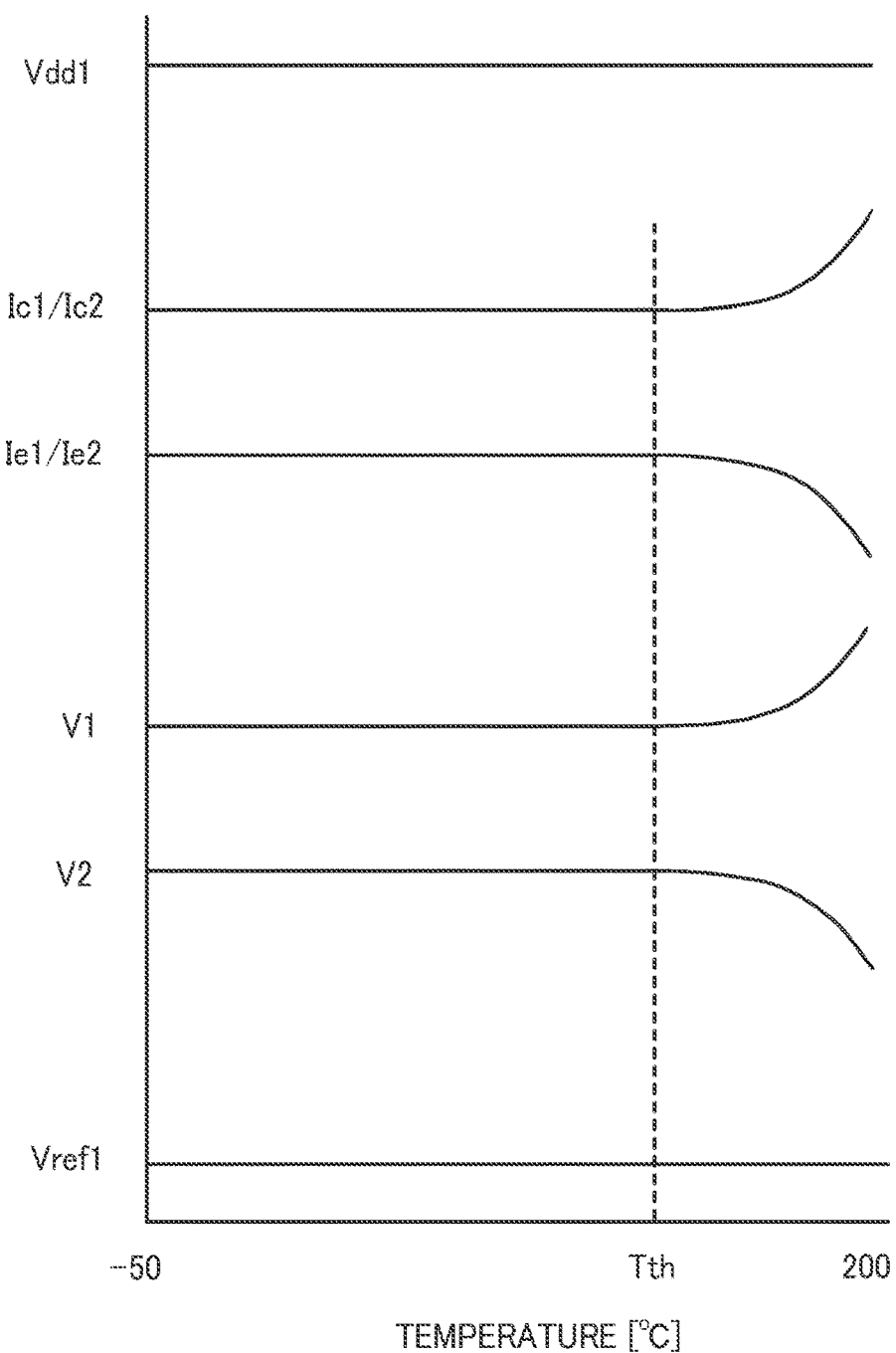

FIG. 4 illustrates an example schematic diagram illustrating changes in current and voltage with temperature in the voltage reference circuit 52a. FIG. 4 schematically illustrates the voltages Vdd1, V1, V2, and Vref1 and the currents Ic1, Ic2, Ie1, and Ie2 with temperature on the horizontal axis. In the first embodiment, the graphs are illustrated for the case where leakage current occurs in the bipolar transistors 74 and 75 at temperatures not lower than the predetermined temperature threshold Tth.

The voltage Vdd1 is supplied from the power supply 22a through the power supply line L1a. The voltage Vdd1 of the first embodiment is not affected by temperature changes.

The current Ic1 supplied by the MOS transistor 71 and the current Ic2 supplied by the MOS transistor 72 increase as the currents flowing through the bipolar transistors 65 and 67 of the temperature compensation circuit 51a increase. When leakage currents occur in the bipolar transistors 65 and 67, the leakage currents Is1 and Is2 also occur in the bipolar transistors 74 and 75.

In the temperature range not lower than the predetermined temperature threshold Tth, the currents Ic1 and Ic2 therefore increase with the leakage currents Is1 and Is2. In the first embodiment, the size of the bipolar transistor 74 is the same as that of the bipolar transistor 75. The leakage currents Is1 and Is2 therefore satisfy the formula: Is1=Is2 and increase at the same rate.

On the other hand, the current Ie1 flowing out through the emitter electrode of the bipolar transistor 74 and the current Ie2 flowing out through the emitter electrode of the bipolar transistor 75 decrease as the leakage currents Is1 and Is2 increase.

Herein, the voltage V1 satisfies the formula: V1=(Ie1+Is1)×(the resistance value of the resistor 73)+(the voltage drop across the bipolar transistor 74), and the voltage V2 satisfies the formula: V2=(the resistance value of the resistor 76)×Ie2+(the voltage drop across the bipolar transistor 75). In this case, the voltage V1 increases as the leakage current Is1 increases, and the voltage V2 decreases as the leakage current Is2 increases.

In the bipolar transistors 74 and 75, the collector and base electrodes are coupled to each other. The voltage drop across each of the bipolar transistors 74 and 75 corresponds to the forward voltage of a diode. The voltage drops across the bipolar transistors 74 and 75 are 0.7 V, for example. Since the bipolar transistors 74 and 75 are of the same size, the voltage drops across the bipolar transistors 74 and 75 are equal to each other.

In the first embodiment, the resistance value of the resistor 73 is equal to the resistance value of the resistor 76. The absolute value of an increase in the voltage V1 across the bipolar transistor 74 due to a temperature increase therefore can be substantially equal to that of a decrease in the voltage V2 across the bipolar transistor 75.

In the first embodiment, the resistors 81 and 82 are identical. The reference voltage Vref1 is a voltage obtained by equally dividing the voltages V1 and V2. In the first embodiment, the increase in the voltage V1 is substantially equal in magnitude to the decrease in the voltage V2, so that the graph of the reference voltage Vref1 is substantially flat across temperature changes.

According to the first embodiment, even if the voltage generation circuit 41a is exposed to high temperatures, the voltage reference circuit 52a, which is a small-scale circuit including fewer circuit components and occupying a smaller circuit area, is able to output the flat reference voltage Vref1.

Furthermore, when the output circuit 77 is composed of a divider circuit, for example, the voltage division ratio for the voltages V1 and V2 can be unbalanced by intentionally unbalancing the ratio of the resistance values of the resistors 81 and 82.

In this case, the voltage reference circuit 52a of the first embodiment can output the reference voltage Vref1 with the temperature characteristics intentionally biased toward a desired characteristic.

For example, when a circuit located at the output stage of the voltage generation circuit 41a has a temperature characteristic in which the operation delay increases at high temperatures if the received reference voltage Vref1 is unchanged, applying a positive bias to the temperature characteristic of the reference voltage Vref1 will eliminate the operation delay of the circuit.

According to the voltage reference circuit 52a of the first embodiment, the reference voltage Vref1 with a desired temperature characteristic is outputted by adjusting the resistance values of the resistors 81 and 82 of the voltage divider circuit, the resistance values of the resistors 73 and 76, the size of the bipolar transistors 74 and 75, the size of the MOS transistors 71 and 72, and the like.

In the first embodiment, the influences of the leakage currents Is1 and Is2 on the reference voltage Vref1 can be adjusted with the configuration of the voltage reference circuit 52a. The influences of the leakage currents Is1 and Is2 on the reference voltage Vref1 therefore can be adjusted without any additional process such as providing an isolation region to prevent occurrence of the leakage currents Is1 and IS2 around the PN junction region in the bipolar transistors 74 and 75.

According to the first embodiment, the influences of the leakage currents Is1 and Is2 can be adjusted without increasing the number of steps of the semiconductor process. That is, the voltage reference circuit 52a of the first embodiment contributes to reduction in manufacturing cost.

In the high side, the voltage generation circuit 41b includes the temperature compensation circuit 51b and voltage reference circuit 52b which are similarly configured to those of the voltage generation circuit 41a of the first embodiment. The voltage generation circuit 41b therefore is able to output the reference voltage Vref2 with a desired temperature characteristic.

<<Parallel Configuration of Temperature Compensation Circuit 51a and Voltage Reference Circuit 52a>>

Herein, increases in the current Ic1 and Ic2 mean increases in currents flowing out from the drain electrodes of the MOS transistors 71 and 72. Since the MOS transistors 71 and 72 are P-MOS transistors, the currents flowing out from the drain electrodes increase when the gate voltages of the MOS transistors 71 and 72 decrease.

On the other hand, in the temperature range not lower than the threshold temperature Tth, leakage currents occur in the bipolar transistors 65 and 67 of the temperature compensation circuit 51a. This increases the currents flowing through the current mirror circuits 68 and 69.

Since the MOS transistors 61 and 62 constituting the current mirror circuit 68 are P-MOS transistors, the gate voltages of the MOS transistors 61 and 62 decrease as the currents in the current mirror circuit 68 increase.

The gate electrodes of the MOS transistors 61 and 62 of the current mirror circuit 68 of the temperature compensation circuit 51a of the first embodiment and the gate electrodes of the MOS transistors 71 and 72 are coupled in parallel. When the gate voltages of the MOS transistors 71 and 72 of the voltage reference circuit 52a decrease due to the leakage currents Is1 and Is2 of the bipolar transistors 74 and 75, reduced voltage is also supplied from the temperature compensation circuit 51a.

That is, the MOS transistor 62 of the temperature compensation circuit 51a serves as a bias voltage source to supply a bias voltage corresponding to the currents flowing through the bipolar transistors 65 and 67 to the gate electrodes of the MOS transistors 71 and 72.

In the first embodiment, therefore, the currents Ic1 and Ic2 increase with the leakage currents Is1 and Is2. This stabilizes the reference voltage Vref1 outputted from the voltage reference circuit 52a.

Figure 5:
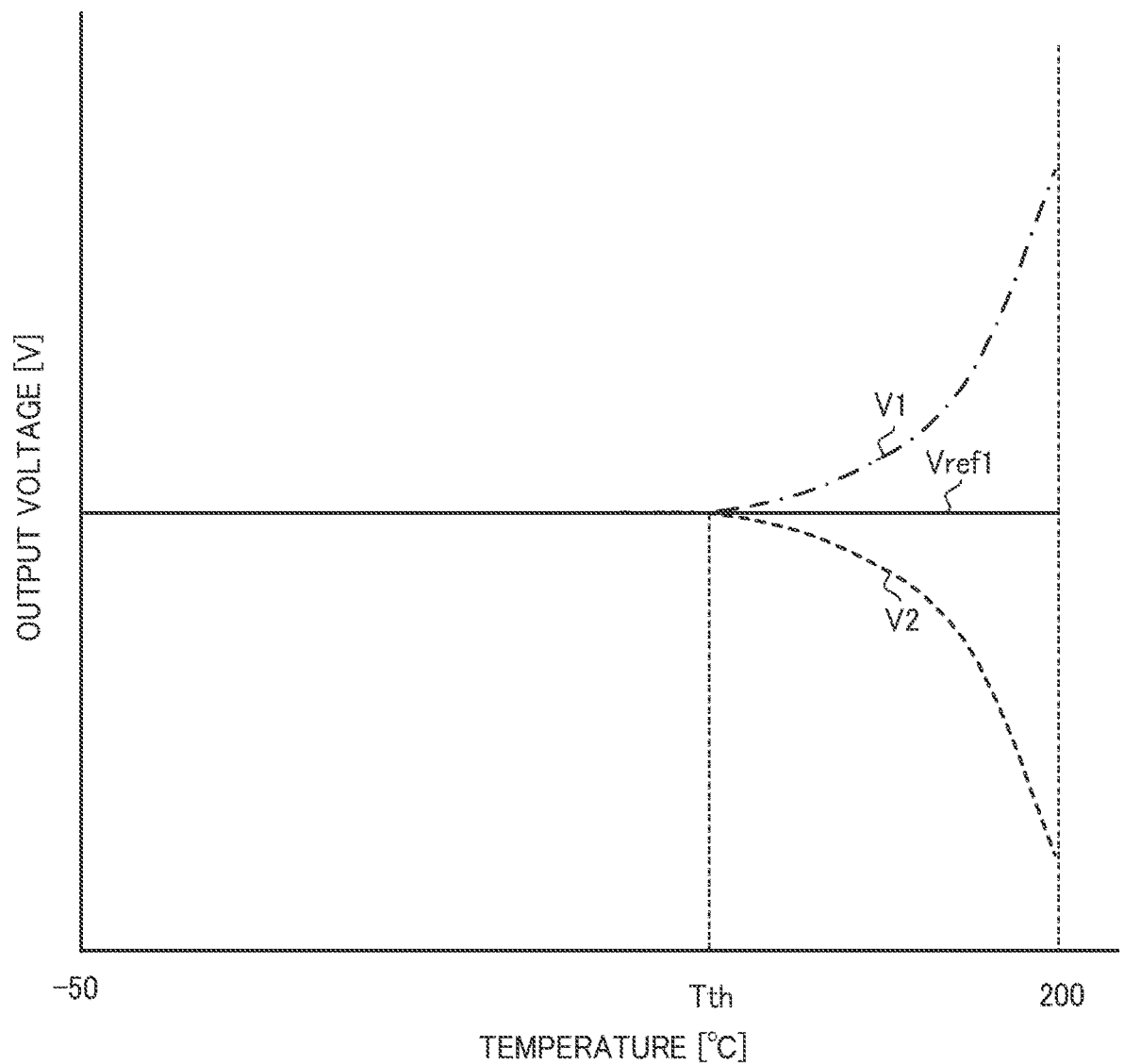
FIG. 5 illustrates example changes in voltages V1, V2, and Vref1 with temperature.

FIG. 5 illustrates example changes in the voltages V1, V2, and Vref1 with temperature. In FIG. 5, the voltage V1 is indicated by a dashed-dotted line, and the voltage V2 is indicated by a dashed line.

In the first embodiment, the increase in the voltage V1 and the decrease in the voltage V2 are adjusted equally in magnitude in the temperature range not lower than the temperature threshold Tth by adjusting the resistance values of the resistors 73 and 76, the size of the bipolar transistors 74 and 75, the size of the MOS transistors 71 and 72, and the like.

In the first embodiment, the output of the reference voltage Vref1 can be adjusted to be substantially flat by equalizing the resistance value of the resistors 81 and 82 of the voltage divider circuit. Thus, the voltage reference circuit 52a outputs the reference voltage Vref1 with the temperature characteristic improved at high temperatures.

===Comparative Example===

Figure 6:
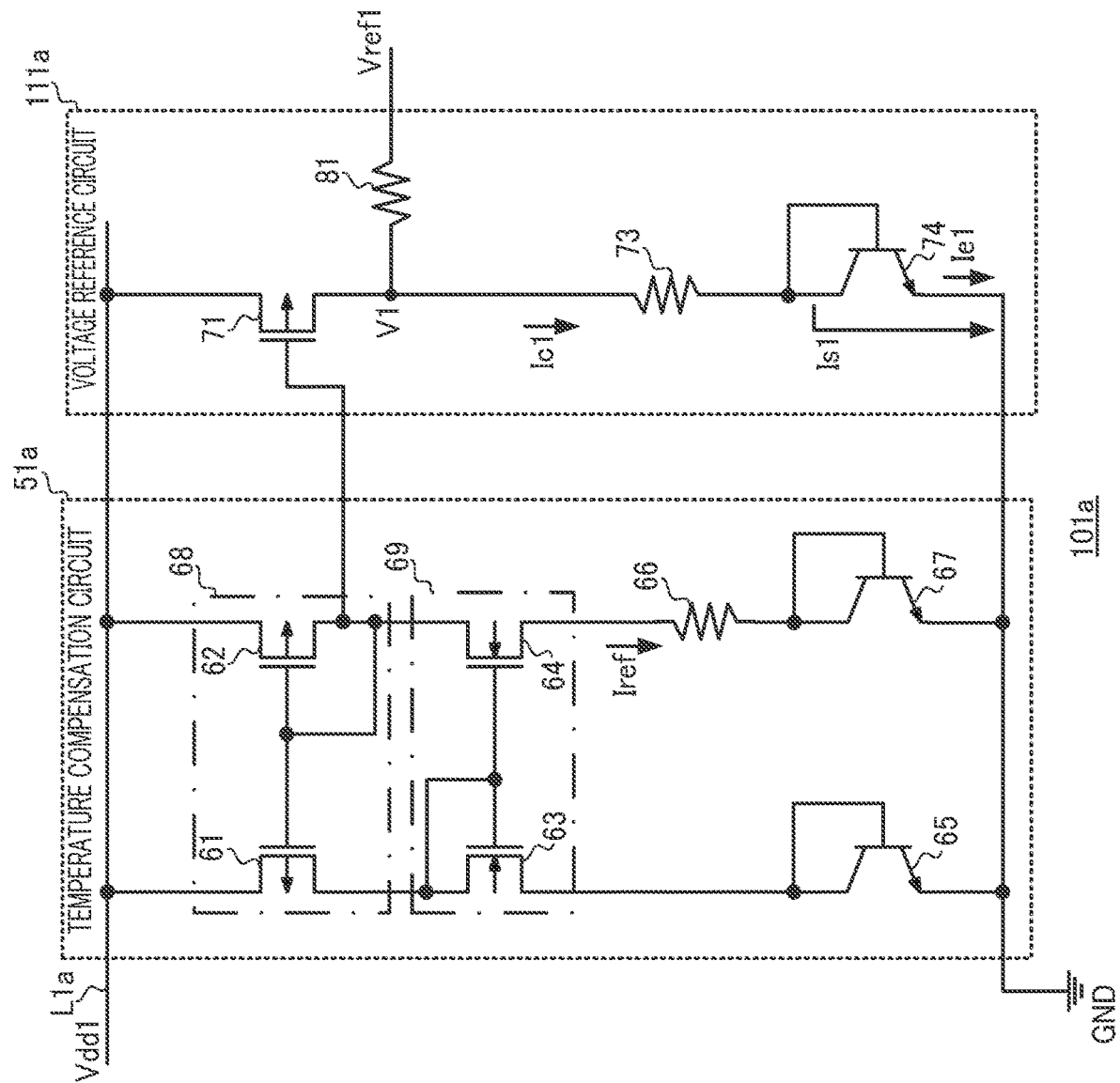
FIG. 6 is an example circuit diagram of a voltage generation circuit 101a according to a comparative example.

FIG. 6 is an example circuit diagram of a voltage generation circuit 101a according to a comparative example. The voltage generation circuit 101a is coupled within the semiconductor module in the same manner as the voltage generation circuit 41a.

The voltage generation circuit 101a includes the temperature compensation circuit 51a and a voltage reference circuit 111a. The temperature compensation circuit 51a is the same as the circuit included in the voltage generation circuit 41a, and the voltage reference circuit 111a has a different configuration from that of the voltage reference circuit 52a. The following description focuses mainly on the differences in configuration between the voltage generation circuits 41a and 101a.

The voltage reference circuit 111a, unlike the voltage reference circuit 52a, does not include the line on which the MOS transistor 72, bipolar transistor 75, and resistor 76 are provided. The voltage reference circuit 111a does not include the node at which the voltage V2 is generated and the resistor 82 for voltage division of the voltage V2.

Similar to the voltage reference circuit 52a, the leakage current Is1 occurs in the bipolar transistor 74 due to the mechanism illustrated in FIG. 3. The current Ic1 increases with occurrence of the leakage current Is1.

In the comparative example, the voltage V1 similarly satisfies the formula: V1=(Ie1+Is1)×(the resistance value of the resistor 73)+(the voltage drop across the bipolar transistor 74). In the comparative example, since the voltage reference circuit 111a does not include the resistor 82, the reference voltage Vref1 to be supplied from the voltage reference circuit 111a is given by subtracting a voltage drop across the resistor 81 from the voltage V1.

===Temperature Characteristic of Voltage and Current in Voltage Reference Circuit 111a===

Figure 7:
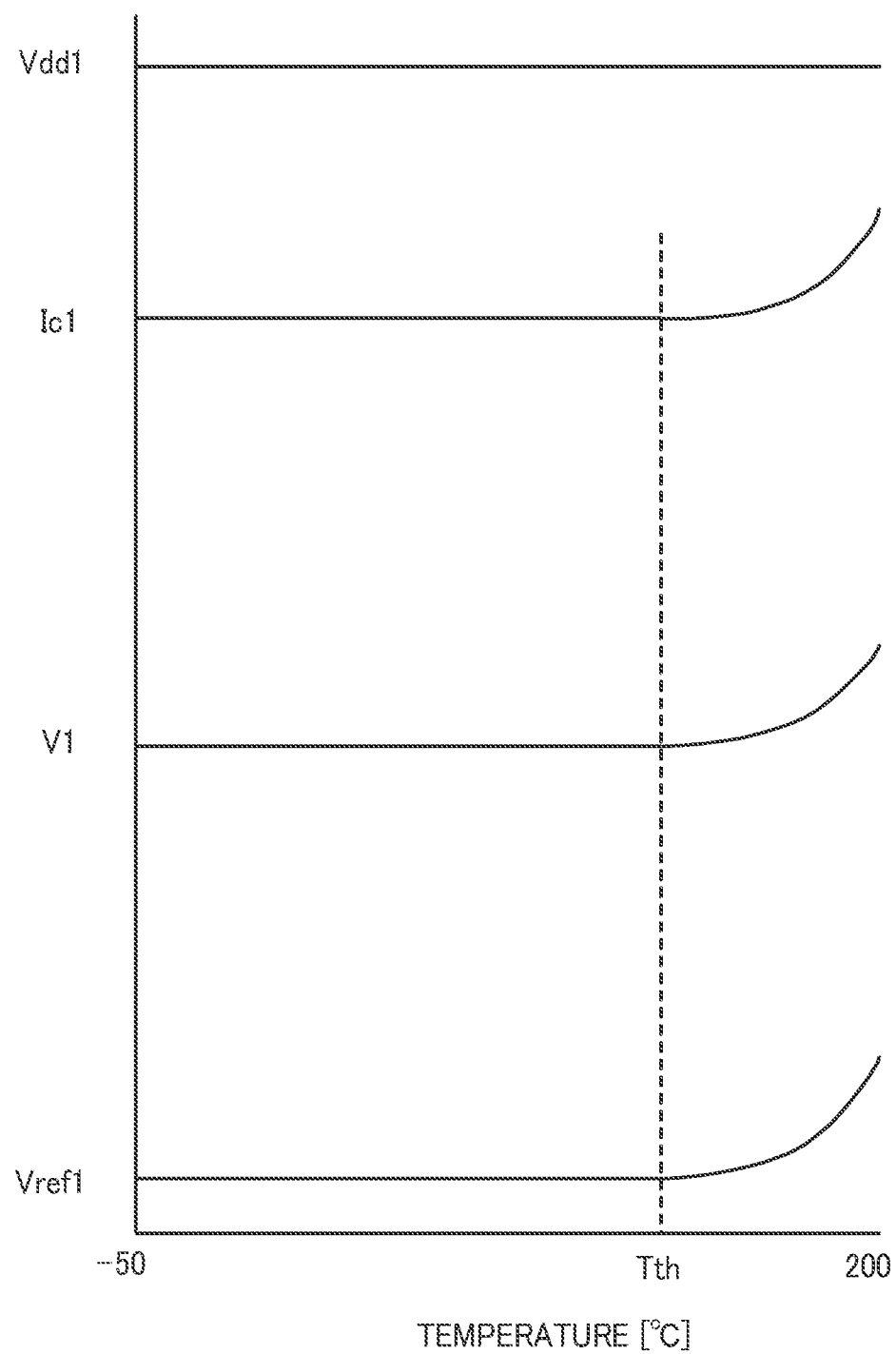

FIG. 7 is an example schematic diagram illustrating changes in current and voltage with temperature in the voltage generation circuit 101a according to the comparative example. FIG. 7 schematically illustrates the voltages Vdd1, V1, and Vref1 and current Ic1 with temperature on the horizontal axis.

In the comparative example, the voltage Vdd1 is not affected by temperature changes similarly to the voltage Vdd1 in FIG. 4.

In the comparative example, the leakage current Is1 also occurs due to the mechanism illustrated in FIG. 3 in the temperature range not lower than the temperature threshold Tth. In this case, the current Ic1 increases with the leakage current Is1.

The voltage V1 satisfies the formula: V1=(Ie1+Is1)×(the resistance value of the resistor 73)+(the voltage drop across the bipolar transistor 74). The voltage V1 therefore increases as the leakage current Is1 increases.

The voltage reference circuit 111a according to the comparative example is not provided with a node at which the voltage V2 to cancel the influence of the increase in the voltage V1 is generated. The reference voltage Vref1 outputted from the voltage reference circuit 111a is a voltage obtained by subtracting a voltage drop across the resistor 81 from the voltage V1. The reference voltage Vref1 outputted from the voltage reference circuit 111a therefore increases with the voltage V1.

In the comparative example, as described above, the reference voltage Vref1 from the voltage reference circuit 111a increases with occurrence of the leakage current Is1. In contrast, the voltage reference circuit 52a of the first embodiment supplies the reference voltage Vref1 with a desired temperature characteristic, with the small-scale circuit configuration including fewer circuit components and occupying a smaller circuit area.

<<Integrated Circuit 23c>>

Figure 8:
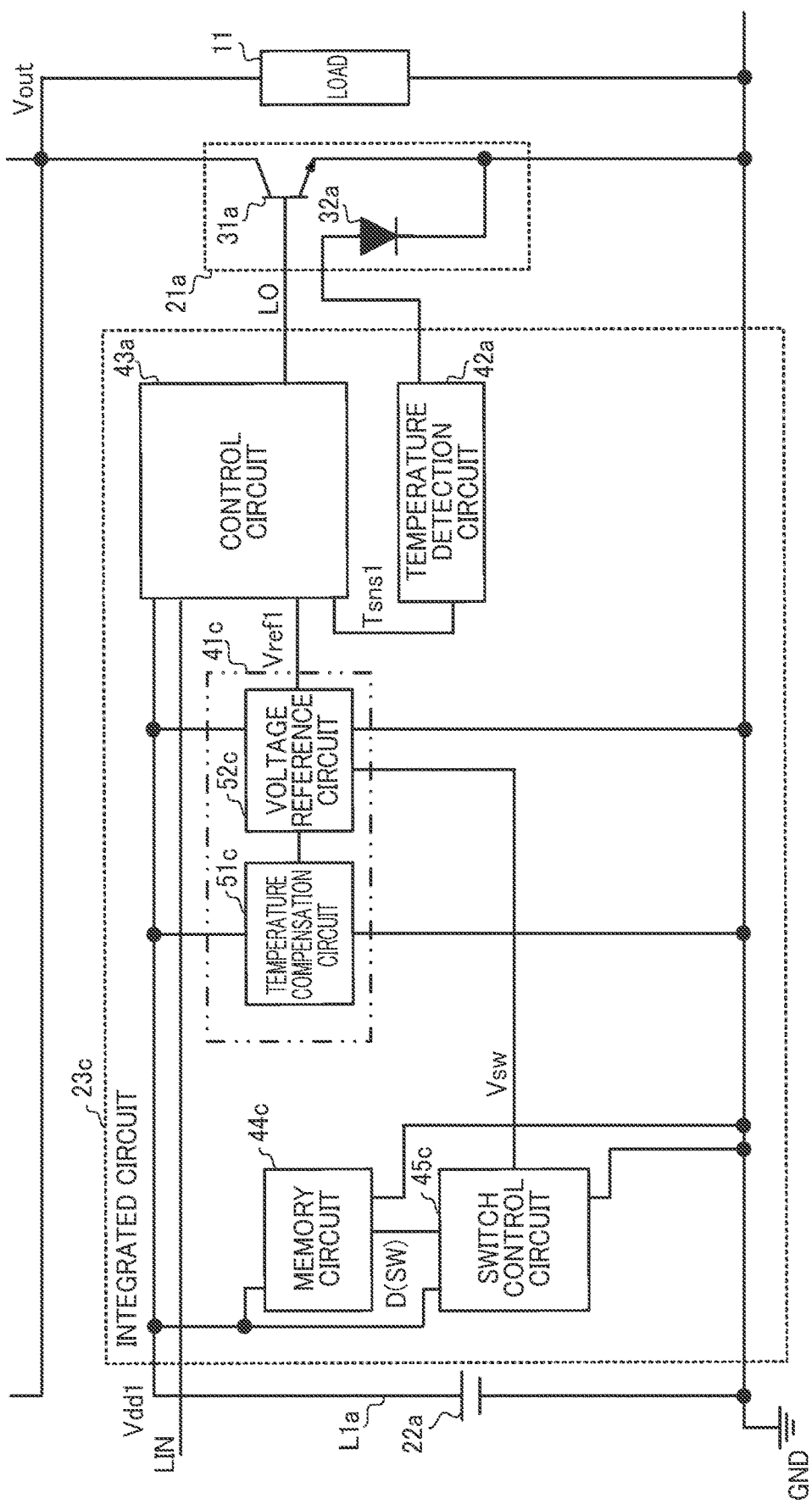
FIG. 8 illustrates an example configuration of an integrated circuit 23c.

Next, an integrated circuit 23c of a second embodiment is described with reference to FIG. 8. In FIG. 8, the configurations denoted by the same reference numerals as those in FIG. 1 correspond to the same configurations.

The integrated circuit 23c is an LVIC similarly to the integrated circuit 23a. The integrated circuit 23c, similarly to the integrated circuit 23a, outputs the driving signal LO to the gate electrode of the IGBT 31a of the semiconductor chip 21a based on the signal LIN inputted from a microcomputer (not illustrated) to control the IGBT 31a. The integrated circuit 23c includes a voltage generation circuit 41c, the temperature detection circuit 42a, the control circuit 43a, a memory circuit 44c, and a switch control circuit 45c. The integrated circuit 23c differs from the integrated circuit 23a in including the voltage generation circuit 41c, memory circuit 44c, and switch control circuit 45c.

In the high side of the integrated circuit 23c, an integrated circuit 23d (not illustrated) is provided. The integrated circuit 23d includes the same configuration as that of the integrated circuit 23c. The integrated circuit 23d includes a voltage generation circuit 41d, the temperature detection circuit 42b, the control circuit 43b, a memory circuit 44d, and a switch control circuit 45d. As for the correspondence between the integrated circuits 23c and 23d, the circuit configuration in the low side is the same as that in the high side. The following description focuses on the circuits in the low side.

The memory circuit 44c stores data D (SW) corresponding to information representing on/off status of switches 131a to 131c, switches 122a to 122c, switches 124a to 124m, and switches 133a to 133n, which are described later in FIG. 9. The memory circuit 44c is an erasable programmable read only memory (EP-ROM) in which a user can externally write or erase data via communication, for example.

The switch control circuit 45c outputs a signal Vsw to change the status of each switch within the voltage reference circuit 52c. The switch control circuit 45c controls the on/off operation of the switches 131a to 131c, switches 122a to 122c, switches 124a to 124m, and switches 133a to 133n, which are described later in FIG. 9, based on the data D(SW).

Herein, the switch control circuit 45c corresponds to a "first control circuit".

==Voltage Generation Circuit 41c==

The voltage generation circuit 41c of the second embodiment includes the temperature compensation circuit 51c and voltage reference circuit 52c. The temperature compensation circuit 51c has the same configuration as that of the temperature compensation circuit 51a. The voltage reference circuit 52c has a different configuration from that of the voltage reference circuit 52a.

Hereinafter, the configuration of the voltage reference circuit 52c is described in detail with reference to FIG. 9.

==Voltage Reference Circuit 52c==

Figure 9:
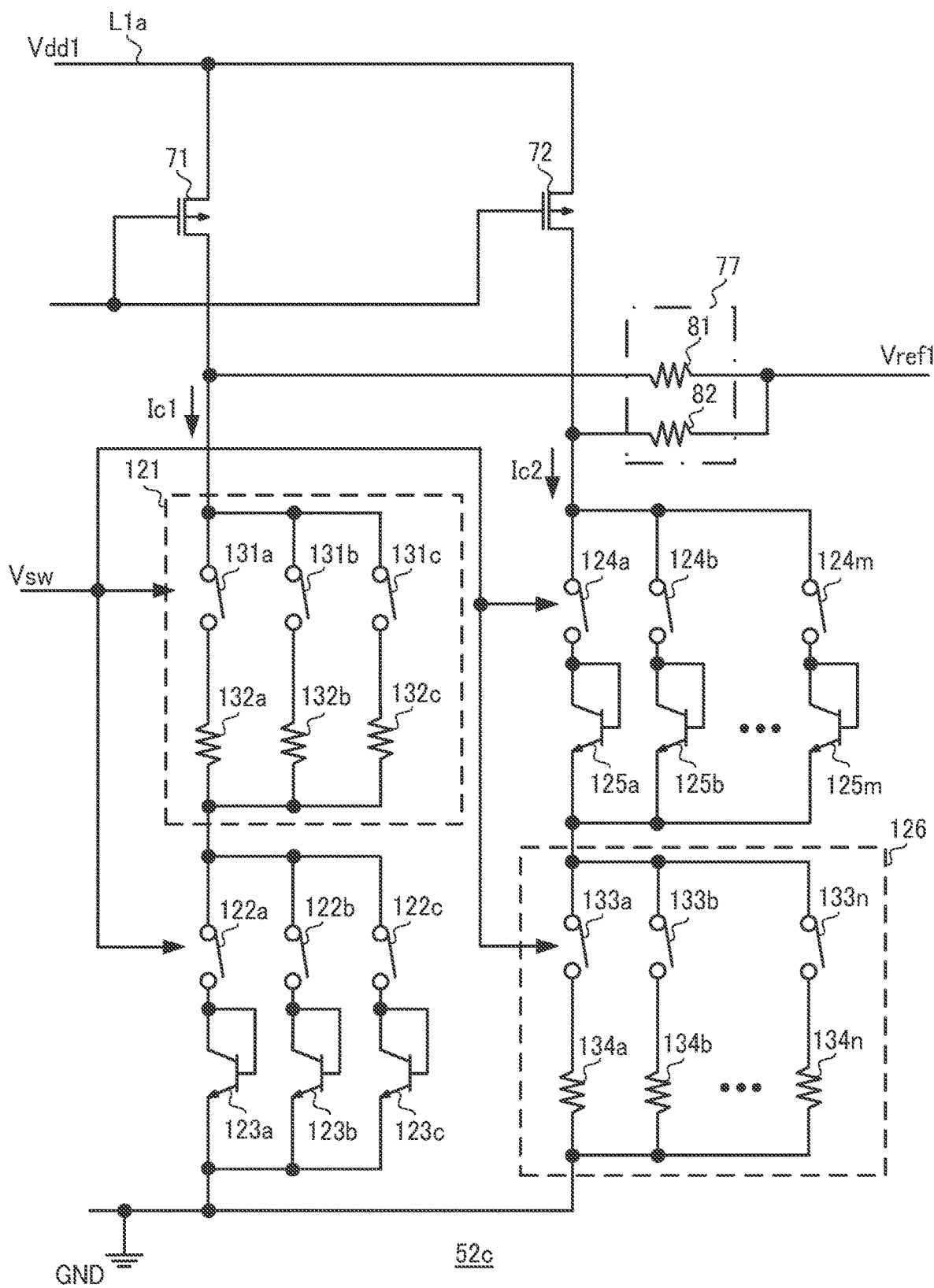
FIG. 9 illustrates an example configuration of a voltage reference circuit 52c.

FIG. 9 illustrates an example configuration of the voltage reference circuit 52c. In FIG. 9, the configurations denoted by the same reference numerals as those of the voltage reference circuit 52a in FIG. 2 correspond to the same configurations.

The voltage reference circuit 52c includes the MOS transistors 71 and 72, variable resistors 121 and 126, switches 122a to 122c and 124a to 124m, bipolar transistors 123a to 123c and 125a to 125m, and output circuit 77.

The variable resistor 121 includes the switches 131a to 131c and resistors 132a to 132c, and the variable resistor 126 includes the switches 133a to 133n and resistors 134a to 134n.

===Operation Overview of Voltage Reference Circuit 52c===

In the voltage reference circuit 52c, the status of each switch can be adjusted by trimming at room temperature and high temperature so that the reference voltage Vref1 has desired characteristics at room temperature and at high temperature. The "room temperature" is, for example, 25° C., and the "high temperature" is, for example, 175° C. The temperature set as the "high temperature" is not limited to 175° C. and may be any temperature determined according to the specification of the semiconductor module 10.

In the voltage reference circuit 52c, particularly, the switches 124a to 124m are used to adjust the temperature characteristic of the reference voltage Vref1 for different temperatures. On the other hand, the switches 122a to 122c, switches 131a to 131c, and switches 133a to 133n are used to correct the offset value of the reference voltage Vref1 from a desired voltage value.

In the trimming of the integrated circuit 23c of the second embodiment, the switch control circuit 45c operates the switches based on the data D (SW) stored in the memory circuit 44c in order to change the number of coupled resistors and the number of coupled bipolar transistors. That is, the switches 122a to 122c, switches 124a to 124m, switches 131a to 131c, and switches 133a to 133n individually serve as trimming devices for adjustment of the temperature characteristic and voltage.

The trimming performed in the voltage reference circuit 52c is not limited to trimming using the memory circuit 44c and switches. The trimming may be laser trimming that fuses connections or resistors. When switches are used as the trimming devices like the second embodiment, the setting of the switches can be changed by performing trimming repeatedly.

===Configuration of Voltage Reference Circuit 52c===

The variable resistor 121 changes in resistance value based on the signal Vsw outputted from the switch control circuit 45c. Specifically, the variable resistor 121 includes the switches 131a to 131c and resistors 132a to 132c. The number of resistors that are coupled in parallel among the resistors 132a to 132c is varied based on the signal Vsw outputted from the switch control circuit 45c. One end of the variable resistor 121 is coupled to the MOS transistor 71.

In the second embodiment, the variable resistor 121 includes the three switches 131a to 131c and the resistors 132a to 132c corresponding thereto. The number of the switches 131a to 131c and the number of the resistors 132a to 132c corresponding thereto are not limited to three but need to be not less than two.

The switches 122a to 122c change the number of bipolar transistors that are coupled in parallel among the bipolar transistors 123a to 123c in response to the signal Vsw. The switches 122a to 122c are coupled to the other end of the variable resistor 121.

Each of the bipolar transistors 123a to 123c gives a positive contribution to the temperature characteristic of the reference voltage Vref1. The bipolar transistors 123a to 123c are coupled to the corresponding switches 122a to 122c, respectively. That is, the bipolar transistors 123a to 123c are coupled to the other end of the variable resistor 121 through the switches 122a to 122c, respectively.

The switches 122a to 122c are provided on the variable resistor 121's side of the respective nodes coupled to the base and collector electrodes of the diode-connected bipolar transistors 123a to 123c. This prevents current from flowing into the base or collector electrode of any one of the bipolar transistors 123a to 123c when the corresponding one of the switches 122a to 122c is off.

When any one of the switches 122a to 122c is off, it is therefore possible to prevent leakage current from occurring in the corresponding one of the bipolar transistors 123a to 123c.

In the second embodiment, the three switches 122a to 122c and the three bipolar transistors 123a to 123c are provided. However, the numbers of switches and bipolar transistors are not limited to three. The trimming can be performed with two or more integral numbers of switches and bipolar transistors. The smaller the bipolar transistors and the greater the numbers of switches and corresponding bipolar transistors, in particular, the more finely the temperature characteristic of the output of the reference voltage Vref1 can be adjusted.

The switches 124a to 124m change the number of bipolar transistors that are coupled in parallel among the bipolar transistors 125a to 125m in response to the signal Vsw. The switches 124a to 124m are coupled to the drain electrode of the MOS transistor 72. In the second embodiment, the number of the switches 124a to 124m is m (m is a positive integer).

Each of the bipolar transistors 125a to 125m gives a negative contribution to the temperature characteristic of the reference voltage Vref1. That is, increasing the number of bipolar transistors that are coupled in parallel among the bipolar transistors 125a to 125m increases leakage current occurring due to exposure of the voltage reference circuit 52c to high temperatures. Increasing the number of bipolar transistors that are coupled in parallel among the bipolar transistors 125a to 125m therefore varying negative the slope of the temperature characteristic of the reference voltage Vref1.

The number of the bipolar transistors 125a to 125m corresponds to the number of switches 124a to 124m. In the second embodiment, the number of the bipolar transistors 125a to 125m is m (m is a positive integer) similar to the switches 124a to 124m.

The bipolar transistors 125a to 125m are diode-connected transistors. The bipolar transistors 125a to 125m are coupled to the switches 124a to 124m, respectively.

The switches 124a to 124m are provided on the variable resistor 121's side of the respective nodes coupled to the base and collector electrodes of the diode-connected bipolar transistors 125a to 125m. When any one of the switches 124a to 124m is off, it is therefore possible to prevent leakage current from occurring in the corresponding one of the bipolar transistors 125a to 125m.

The variable resistor 126 changes in resistance value based on the signal Vsw. Specifically, the variable resistor 126 includes the switches 133a to 133n and resistors 134a to 134n. The number of resistors that are coupled in parallel among the resistors 134a to 134n changes in response to the signal Vsw outputted from the switch control circuit 45c. The variable resistor 126 can thereby change the offset value of the reference voltage Vref1 from a desired value (1.2 V, for example).

The resistors 134a to 134n discretely change the resistance value of the variable resistor 126 depending on the on/off status of the switches 133a to 133n. The resistance value of the variable resistor 126 is less likely to fluctuate depending on the noise and current conditions than the resistance value of the variable resistor 126 that is continuously changed.

In the second embodiment, the resistors provided at the positions of the variable resistors 121 and 126 are both variable resistors. Note that one of the resistors may be a variable resistor while the other resistor is a resistor with a fixed resistance value.

Herein, the "switches 124a to 124m" correspond to "a plurality of first trimming devices". The "switches 131a to 131c" correspond to "a plurality of second trimming devices".

The variable resistor 121 corresponds to a "first resistor". The variable resistor 126 corresponds to a "second resistor".

Each of the bipolar transistor 123a to 123c may be a bipolar transistor which is the same as or is different from the bipolar transistor 74 illustrated in FIG. 2. The bipolar transistors 123a to 123c correspond to "a plurality of first bipolar transistors".

In a similar manner, each of the bipolar transistors 125a to 125m may be a bipolar transistor which is the same as or is different from the bipolar transistor 75 illustrated in FIG. 2. The bipolar transistors 125a to 125m correspond to "a plurality of second bipolar transistors".

===Reference Voltage Vref1 Outputted from Voltage Reference Circuit 52c===

Figure 10:
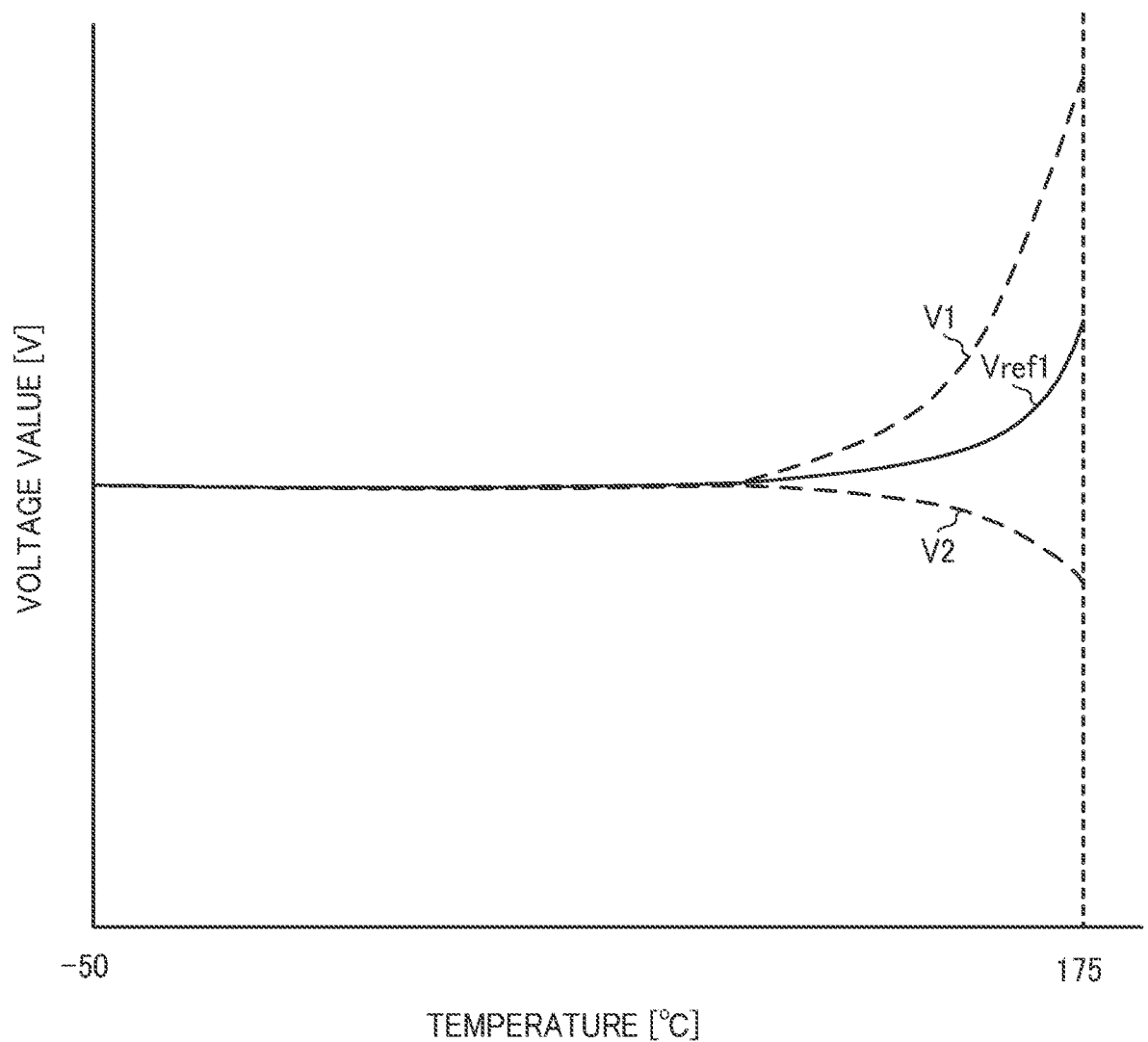
FIG. 10 illustrates an example of the reference voltage Vref1 outputted from the voltage reference circuit 52c.

FIG. 10 illustrates an example of the reference voltage Vref1 outputted from the voltage reference circuit 52c.

Herein, the resistance of the variable resistor 121 is denoted by r1; the combined resistance of the bipolar transistors 123a to 123c, R1; leakage current of the bipolar transistors 125a to 125m, ΔIL; the combined resistance thereof, R2; and the resistance of the variable resistor 126, r2.

The current Ic1 is a current supplied from the MOS transistor 71 to the bipolar transistors 123a to 123c, and ΔIc1 is an increase in the current Ic1 due to a temperature increase. Similarly, the current Ic2 is a current supplied from the MOS transistor 72 to the bipolar transistors 125a to 125m, and ΔIc2 is an increase in the current Ic2 due to the temperature increase. In this case, the voltage V1 and voltage V2 satisfy the following formulae (A) and (B), respectively.

For the voltage V1, $$V1=(Ic1+\Delta Ic1)\times(r1+R1) \quad (A)$$

For the voltage V2, $$V2=(Ic2+\Delta Ic2-\Delta IL)\times(R2+r2) \quad (B)$$

The output circuit 77 in FIG. 9, which is a voltage divider circuit, implements voltage division of the voltages V1 and V2. In the second embodiment, voltage division of the voltages V1 and V2 is implemented with the resistors 81 and 82 of the same resistance value similarly to FIG. 2. The reference voltage Vref1 outputted from the output circuit 77 therefore satisfies: voltage Vref1=(V1+V2)/2.

In FIG. 9, the positive slope of the voltage V1 is greater in magnitude than the negative slope of the voltage V2. The reference voltage Vref1 outputted from the voltage reference circuit 52c has a positive temperature characteristic.

Even if the bipolar transistors 123a to 123c are manufactured to be substantially the same size as the bipolar transistors 125a to 125m, the temperature characteristics of the voltages V1 and V2 are not completely cancelled each other in some cases. This is attributed to, for example, manufacturing variations, differences in coupling locations in the circuit layout, bias voltage for circuit operation that does not satisfy ideal conditions, or the like.

Even in such a case, the voltage reference circuit 52c is able to provide a desired temperature characteristic of the reference voltage Vref1 by adjusting the number of bipolar transistors that are coupled in parallel among the bipolar transistors 125a to 125m. The voltage reference circuit 52c is further described in terms of such adjustment with reference to FIGS. 11 and 12.

===Adjustment of Temperature Characteristic of Reference Voltage Vref1===

Figure 11:
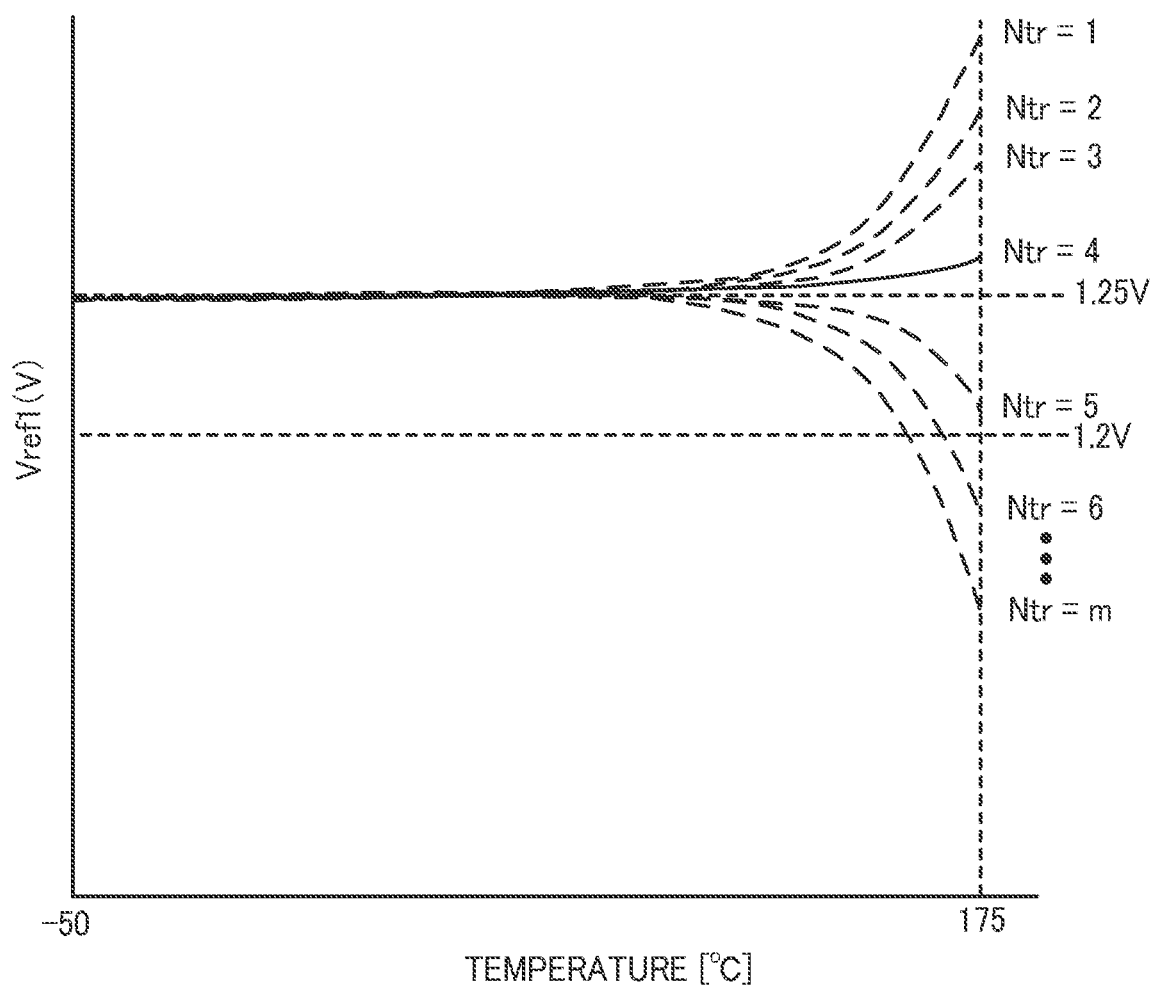
FIG. 11 illustrates examples of the reference voltage Vref1 where the number of switches that are on among switches 124a to 124m is varied.

FIG. 11 illustrates examples of the reference voltage Vref1 where the number of switches that are off among the switches 124a to 124m is varied. In the second embodiment, FIG. 11 illustrates a case where the number of the switches 124a to 124m is m.

In FIG. 11, the number Ntr of switches that are on among the switches 124a to 124m is gradually increased from one to m. When the number Ntr of switches that are on among the switches 124a to 124m is increased, the number of bipolar transistors that are coupled in parallel among the bipolar transistors 125a to 125m increases.

In this case, ΔIc2, ΔIL, and R2 increase in the formula (B): V2=(Ic2+ΔIc2−ΔIL)×(R2+r2). This increases the absolute value of the negative slope of the voltage V2 due to a temperature increase, thus varying negative the slope of the reference voltage Vref (=(V1+V2)/2) outputted from the voltage reference circuit 52c.

When the number Ntr of switches that are on among the switches 124a to 124m is reduced, the absolute value of the negative slope of the voltage V2 decreases, thus varying positive the slope of the reference voltage Vref (=(V1+V2)/2) outputted from the voltage reference circuit 52c.

In the second embodiment, when Ntr=4, the difference between the value of the reference voltage Vref1 at room temperature (25° C., for example) and the value of the reference voltage Vref1 at a high temperature (175° C., for example) is minimized.

In the voltage reference circuit 52c of the second embodiment, Ntr=4 is selected in order to obtain the temperature characteristic of the reference voltage Vref1 with the temperature dependence thereof minimized from room temperature to high temperatures.

Herein, the reference voltage Vref1 outputted from the voltage reference circuit 52c of the second embodiment in FIG. 11 has a voltage value of about 1.25 V at room temperature and has a slightly higher voltage value than 1.25 V at the high temperature. When the desired voltage value of the reference voltage Vref1 outputted from the voltage reference circuit 52c is assumed to be 1.2 V, for example, the reference voltage Vref1 has an offset value of 0.05 V (=1.25−1.2) at room temperature.

The offset value of 0.05 V of the reference voltage Vref1 outputted from the voltage reference circuit 52c can be also adjusted as described below.

===Adjustment of Offset Value of Reference Voltage Vref1===

Figure 12:
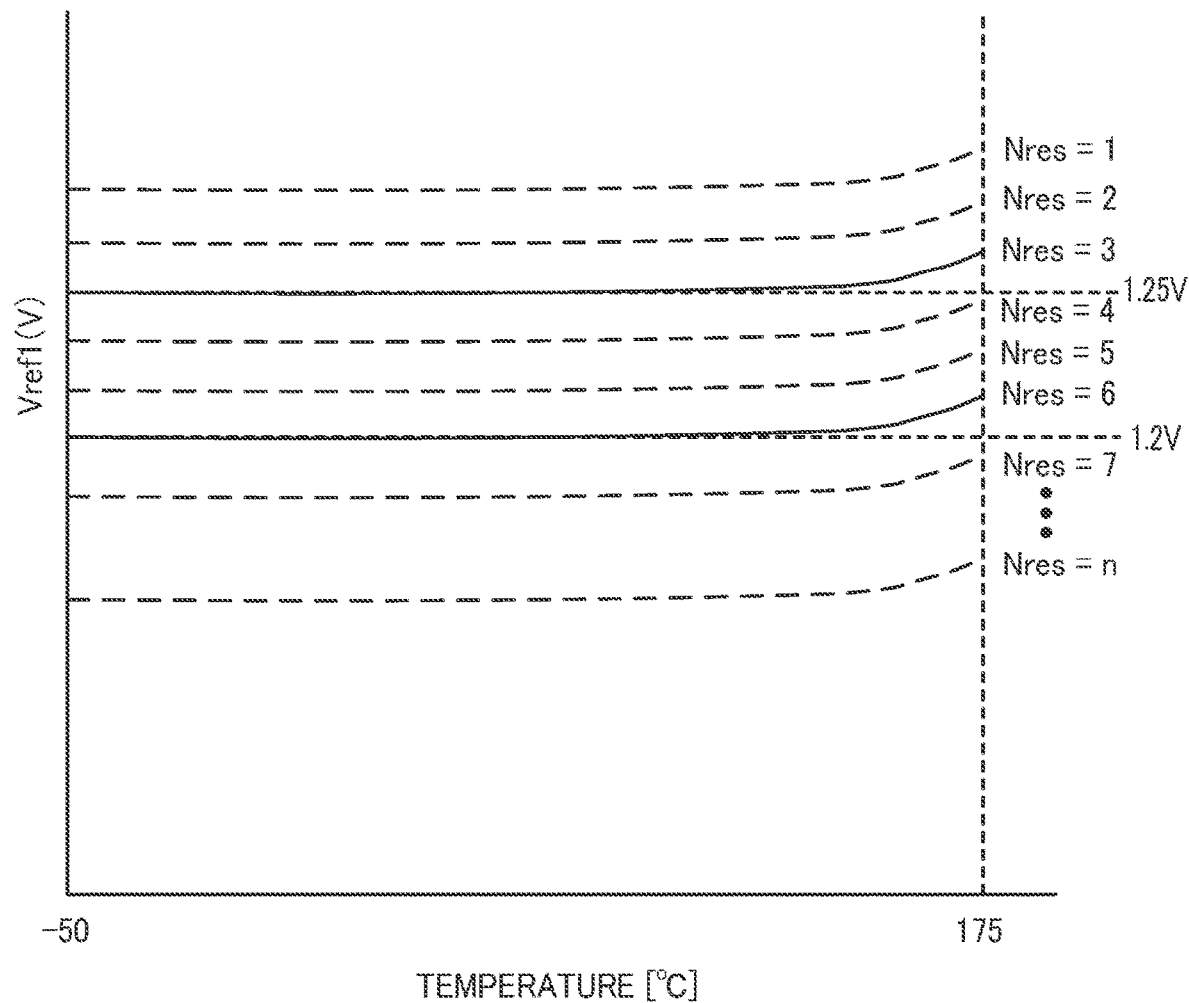
FIG. 12 illustrates examples of the reference voltage Vref1 where the number of switches that are on among switches 133a to 133n is varied.

FIG. 12 illustrates examples of the reference voltage Vref1 where the number of switches that are on among the switches 133a to 133n is varied.

In FIG. 12, the number Nres of switches that are on among the switches 133a to 133n is gradually increased from one to m. In the second embodiment, FIG. 12 illustrates a diagram of the reference voltage Vref1 outputted from the voltage reference circuit 52c, assuming that Nres=3 when the adjustment illustrated in FIG. 11 is finished.

As the number Nres is increased, r2 increases in the formula (B): V2=(Ic2+ΔIc2−ΔIL)×(R2+r2). When the number Nres is increased, the factor (Ic2+ΔIc2−ΔIL) does not increase, unlike the case where the number Ntr is increased. Increasing the number Nres affects the slope of the voltage V2 less than increasing the number Ntr.

When the number Nres is increased, the curve of the reference voltage Vref1 outputted from the voltage reference circuit 52c shifts downward in FIG. 12. When the number Nres is reduced, the curve of the reference voltage Vref1 outputted from the voltage reference circuit 52c shifts upward in FIG. 12.

In the voltage reference circuit 52c of the second embodiment, Nres=6 is selected in order to obtain the reference voltage Vref1 that is less temperature-dependent at high temperatures when the desired voltage thereof at room temperature is 1.2 V. In this case, the reference voltage Vref1 outputted from the voltage reference circuit 52c is close to 1.2 V at room temperature and is less temperature-dependent at high temperatures.

It is also possible to vary the resistance r1 by operating the switches 131a to 131c of the variable resistor 121 and vary the combined resistance R1 of the bipolar transistors 123a to 123c by operating the switches 122a to 122c. In this case, the voltage V1 expressed by the formula (A): V1=(Ic1+ΔIc1)×(r1+R1) changes, and the term contributing to the positive temperature characteristic of the reference voltage Vref1 changes.

The adjustment of the offset value of the reference voltage Vref1 therefore may be performed by varying the voltage V1 through operations for the switches 131a to 131c and switches 122a to 122c.

As the number of switches that are on among the switches 131a to 131c or switches 122a to 122c increases, the reference voltage Vref1 shifts upward. As the number of switches being on among the switches 131a to 131c or switches 122a to 122c decreases, the reference voltage Vref1 shifts downward.

===Trimming Procedure for Voltage Reference Circuit 52c===

Figure 13:
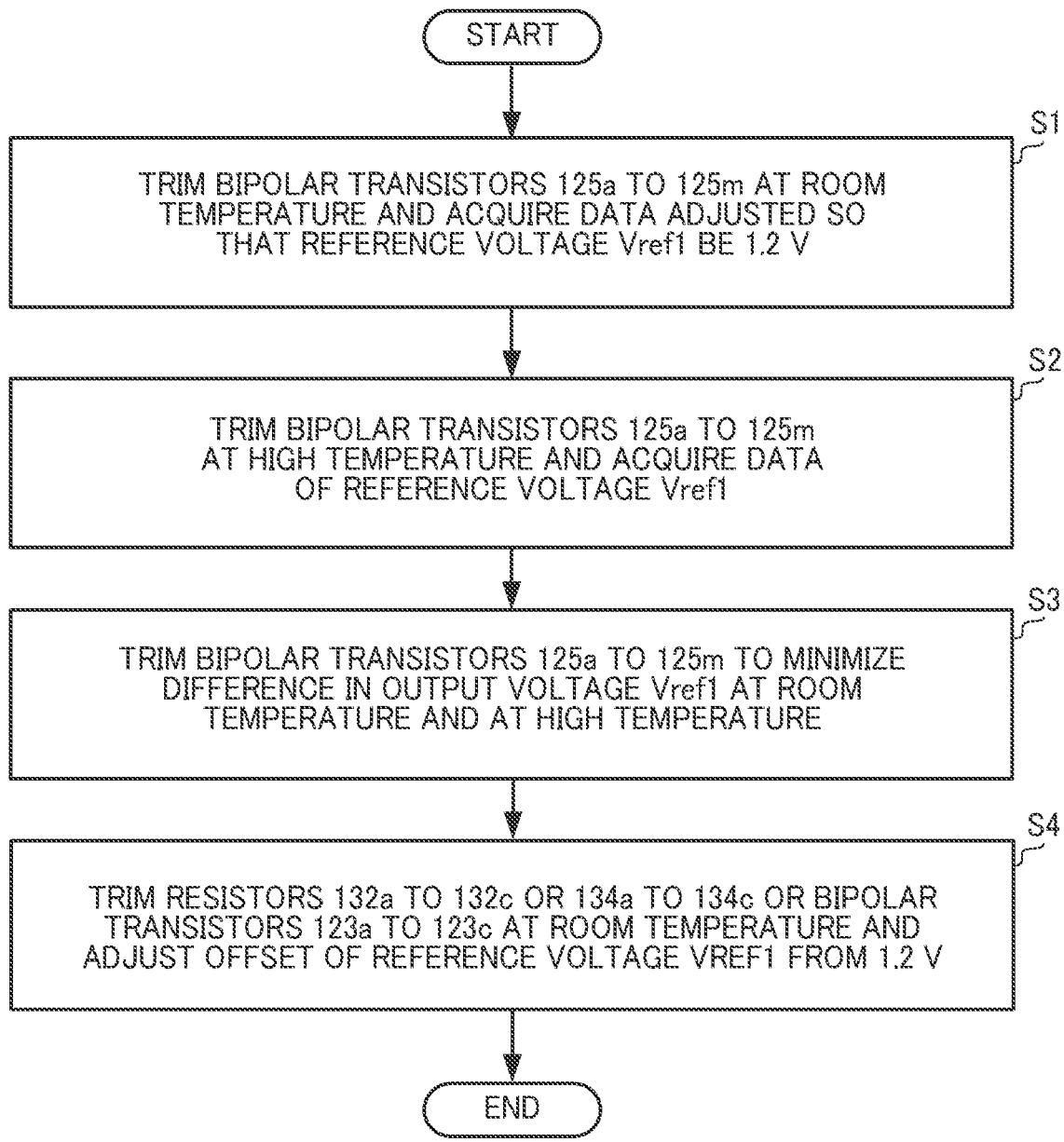
FIG. 13 illustrates an example trimming procedure executed in the voltage reference circuit 52c.

FIG. 13 illustrates a trimming procedure example executed in the voltage reference circuit 52c.

In the following description, trimming is performed using an apparatus such as a not-illustrated semiconductor tester (hereinafter, referred to as a tester), for example.

The tester first performs trimming of the number of bipolar transistors that are coupled in parallel among the bipolar transistors 125a to 125m at room temperature (25° C., for example) and acquires data adjusted so that the reference voltage Vref1 be a desired value (1.2 V, for example) (S1).

"The tester performs trimming of the number of certain devices (resistors, for example) coupled" means that the tester rewrites data in a memory of the IC through a not-illustrated terminal to change the number of certain devices coupled.

Next, at a high temperature (175° C., for example), the tester performs trimming of the number of bipolar transistors that are coupled in parallel among the bipolar transistors 125a to 125m to acquire data of the reference voltage Vref1 (S2).

The tester performs trimming of the number of bipolar transistors that are coupled in parallel among the bipolar transistors 125a to 125m to minimize the difference between the reference voltage Vref1 at room temperature and the reference voltage Vref1 at the high temperature (S3). The voltage reference circuit 52c is therefore able to set the temperature characteristic of the reference voltage Vref1 to be outputted to a desired temperature characteristic.

The tester then performs trimming of the number of resistors that are coupled in parallel among the resistors 132a to 132c or the resistors 134a to 134n or the number of bipolar transistors that are coupled in parallel among the bipolar transistors 123a to 123c at room temperature (S4).

The voltage reference circuit 52c is therefore able to adjust the offset value of the reference voltage Vref1 from a desired value (1.2 V, for example) at room temperature.

As described above, the voltage reference circuit 52c is able to adjust the temperature characteristic of the reference voltage Vref1 to be outputted and adjust the offset thereof from a desired value.

SUMMARY

The semiconductor module 10 and voltage generation circuit 41a of the first embodiment and the voltage generation circuit 101a of the comparative example are described above. The semiconductor module 10 includes the integrated circuit 23a including the voltage reference circuit 52a.

The integrated circuit 23a includes the voltage reference circuit 52a. The voltage reference circuit 52a includes: a current source composed of the MOS transistor 71; a current source composed of the MOS transistor 72 that is provided in parallel to the MOS transistor 71; the resistor 73 with one end coupled to the drain electrode of the MOS transistor 71; the bipolar transistor 74 which is coupled to the other end of the resistor 73 and in which the base and collector electrodes are coupled; the bipolar transistor 75 which is coupled to the MOS transistor 72 and in which the base and collector electrodes are coupled; the resistor 76 coupled to the emitter electrode of the bipolar transistor 75; and the output circuit 77 outputting a voltage based on the voltage V1 outputted from the drain electrode of the MOS transistor 71 and the voltage V2 outputted from the drain electrode of the MOS transistor 72.

The voltage reference circuit 52a is therefore able to supply the reference voltage Vref1 with a desired temperature characteristic based on the voltages V1 and V2 with the small-scale configuration including fewer circuit components and occupying a smaller circuit area.

The bipolar transistors 74 and 75 of the first embodiment are of the same size. It is therefore possible to substantially equally adjust the influence of the leakage currents Ic1 and Ic2 in the bipolar transistors 74 and 75 on the increase in the voltage V1 and the decrease in the voltage V2 produced in a temperature range not lower than the predetermined temperature threshold Tth.

The resistance values of the resistors 73 and 76 of the first embodiment are equal to each other. This can equalize the coefficient of the influences of the leakage currents Is1 and Is2 on the voltage V1 and voltage V2.

The integrated circuit 23c of the second embodiment includes the voltage reference circuit 52c having the configuration illustrated in FIG. 9. The voltage reference circuit 52c includes: a current source composed of the MOS transistor 71; a current source composed of the MOS transistor 72 that is provided in parallel to the MOS transistor 71; the variable resistor 121; the bipolar transistors 123a to 123c; the plurality of switches 124a to 124m; the plurality of bipolar transistors 125a to 125m; the variable resistor 126; the output circuit 77 outputting the reference voltage Vref1 based on the voltage V1 outputted from the current source composed of the MOS transistor 71 and the voltage V2 outputted from the current source composed of the MOS transistor 72.

The temperature characteristic of the reference voltage Vref1 is sometimes difficult to adjust even if the bipolar transistors 123a to 123c and 125a to 125m are adjusted in size. This is attributed to, for example, manufacturing variations, differences in coupling locations in the circuit layout, bias voltage for circuit operation that does not satisfy ideal conditions, or the like. Even in such a case, the integrated circuit 23c is able to adjust the voltages V1 and V2 and output the reference voltage Vref1 with a desired temperature characteristic.

The integrated circuit 23c further includes the plurality of switches 122a to 122c coupled to the other end of the variable resistor 121. The plural bipolar transistors 123a to 123c are coupled to the other end of the variable resistor 121 through the plurality of switches 122a to 122c, respectively.

The integrated circuit 23c is able to adjust the temperature characteristic of the reference voltage Vref1 by varying the size of the bipolar transistors 123a to 123c.

At least one of the devices provided at a place where the plurality of switches 122a to 122c are coupled and at a place where the plurality of switches 124a to 124m are coupled includes a plurality of switches. The integrated circuit 23c includes the switch control circuit 45c controlling the on/off operation of the plurality of switches.

The trimming of the size of the bipolar transistors 123a to 123c or bipolar transistors 125a to 125m in the integrated circuit 23c can be performed repeatedly to reset the size.

At least one of the devices provided at a place where the variable resistor 121 is coupled and at a place where the variable resistor 126 is coupled is a variable resistor. The switch control circuit 45c controls the resistance value of the variable resistor.

It is therefore possible to perform trimming of the resistance value of the variable resistor 121 or 126 in the integrated circuit 23c. By varying the resistance value of the variable resistor 121 or 126, the offset value of the reference voltage Vref1 from a desired value at room temperature can be adjusted.

The variable resistor 121 or variable resistor 126 include a plurality of switches 131a to 131c or switches 133a to 133n to change the resistance value of the variable resistor 121 or variable resistor 126, respectively. The switch control circuit 45c controls on/off operation of the plurality of switches of the variable resistor 121 or 126.

In the integrated circuit 23c, therefore, the resistance value of the variable resistor 121 or 126 can be discretely adjusted. The resistance value of the variable resistor 121 or 126 therefore fluctuates depending on the noise and current conditions less than where the resistance value of the variable resistor 121 or 126 is continuously changed.

Furthermore, the integrated circuit 23c includes the memory circuit 44c storing the data D(SW) that include the information representing the status of the plurality of switches 122a to 122c, 124a to 124m, 131a to 131c, and 133a to 133n. The switch control circuit 45c controls on/off operation thereof based on the data D(SW).

The trimming using the switches in the integrated circuit 23c can be repeatedly performed to change the settings of the switches.

The output circuit 77 of the first embodiment includes the resistor 81 with one end coupled to the drain electrode of the MOS transistor 71 and the resistor 82 with one end coupled to the output of the MOS transistor 72 and the other end coupled to the other end of the resistor 81. Furthermore, the reference voltage Vref1 is a voltage generated at the node between the resistors 81 and 82.

As described above, the output circuit 77 of the first embodiment is a voltage divider circuit composed of the resistors 81 and 82. The output circuit 77 does not include any device increasing the circuit area, such as an op-amp.

The voltage reference circuit 52a of the first embodiment is therefore able to supply the reference voltage Vref1 with a desired temperature characteristic based on the voltages V1 and V2 with the small-scale configuration including fewer circuit components and occupying a smaller circuit area.

The resistance values of the resistors 81 and 82 of the first embodiment are equal to each other. The output circuit 77 therefore equally divides the voltages V1 and V2. When the increase in the voltage V1 is substantially equal to the decrease in the voltage V2, therefore, the voltage reference circuit 52a outputs the reference voltage Vref1 substantially flat.

The temperature compensation circuit 51a of the first embodiment includes the bipolar transistor 67 conducting the current Iref. In the first embodiment, the MOS transistors 71 and 72 are current sources which supply currents corresponding to the current Iref from the drain electrodes.

The currents Ic1 and Ic2 therefore increase with occurrence of leakage current in the bipolar transistor 67. That is, when the leakage currents Is1 and Is2 increase in the voltage reference circuit 52a, the currents Ic1 and Ic2 also increase.

In the temperature range not lower than the temperature threshold Tth, the leakage currents Is1 and Is2 therefore satisfy the formula: Is1=Is2 and increase at the same rate. This facilitates controlling the contribution of the leakage currents Is1 and Is2 to the voltages V1 and V2, stabilizing the reference voltage Vref1 from the voltage reference circuit 52a. Such a configuration is particularly useful for outputting the reference voltage Vref1 which is substantially flat even if the temperature changes.

In the first embodiment, the current source supplying current to the node to which the voltage V1 is applied is the MOS transistor 71. The current source supplying current to the node to which the voltage V2 is applied is the MOS transistor 72. The source electrodes of the MOS transistors 71 and 72 are coupled to the power supply line L1a, and certain gate voltages are applied to the gate electrodes of the MOS transistors 71 and 72.

In the voltage reference circuit 52a, as described above, the current sources supplying the currents to the nodes that the voltages V1 and V2 are applied to are the MOS transistors 71 and 72 and do not include any bipolar device. In the voltage reference circuit 52a, therefore, any large leakage current, like the leakage current that can occur in bipolar devices, does not occur from the current sources supplying the currents to the nodes that the voltages V1 and V2 are applied to.

In the first embodiment, the MOS transistors 71 and 72 are of the same size. The MOS transistors 71 and 72 therefore supply currents equal to each other to the nodes that the voltages V1 and V2 are applied to.

The temperature compensation circuit 51a of the integrated circuit 23a of the first embodiment includes the bipolar transistor 67 and the MOS transistor 62 as the bias voltage source that supplies a bias voltage corresponding to the current value of the current flowing through the bipolar transistor 67. The MOS transistor 62 supplies the bias voltage to the gate electrodes of the MOS transistors 71 and 72.

When the leakage currents Is1 and Is2 occur in the bipolar transistors 74 and 75, leakage current also occurs in the bipolar transistor 67. Depending on the current value of the current flowing through the bipolar transistor 67, the voltage supplied to the gate electrodes of the MOS transistors 71 and 72 from the MOS transistor 62 decreases. The currents Ic1 and Ic2 supplied from the MOS transistors 71 and 72 therefore increase.

That is, when the leakage currents Is1 and Is2 increase, the currents Ic1 and IC2 also increase. In the temperature range not lower than the temperature threshold Tth, the leakage current Is1 and Is2 therefore satisfy the formula: Is1=Is2 and increase at the same rate. This facilitates controlling the contribution of the leakage currents Is1 and Is2 to the voltages V1 and V2 and stabilizes the reference voltage Vref1. Such a configuration is particularly useful for outputting the reference voltage Vref1 which is substantially flat even if the temperature changes.

In the first embodiment, the integrated circuit 23a includes: the current mirror circuit 68 including the P-MOS transistors 61 and 62; the current mirror circuit 69 including the N-MOS transistors 63 and 64 supplied with currents from the current mirror circuit 68; the bipolar transistor 65 which is coupled to one output end of the current mirror circuit 69 and in which the base and collector electrodes are coupled; the resistor 66 coupled to the other output end of the current mirror circuit 69; and the bipolar transistor 67 which is coupled to the resistor 66 and in which the base and collector electrodes are coupled. The node coupling the current mirror circuits 68 and 69 is coupled to the gate electrodes of the MOS transistors 71 and 72.

When the gate voltages of the MOS transistors 71 and 72 of the voltage reference circuit 52a decrease due to the leakage currents Is1 and Is2 in the bipolar transistors 74 and 75, reduced voltage is supplied from the temperature compensation circuit 51a. This stabilizes the operation of the integrated circuit 23a as a whole.

The semiconductor module 10 of the first embodiment includes the integrated circuit 23a and the switching device as the IGBT 31a. The integrated circuit 23a includes the control circuit 43a which is coupled to the gate electrode of the IGBT 31a and controls drive of the switching device based on the input signal LIN. The control circuit 43a controls the drive of the switching device based on the input signal LIN and reference voltage Vref1.

The control circuit 43a is therefore able to drive the switching device based on the reference voltage Vref1 which is supplied from the voltage reference circuit 52a and has a desired temperature characteristic.

The present invention was made in the light of the aforementioned conventional shortcomings, and an object thereof is to provide a circuit supplying a reference voltage having a desired temperature characteristic.

It is possible to provide a circuit supplying a reference voltage having a desired temperature characteristic.

Hereinabove, the invention is described with the embodiments. However, the technical scope of the present invention is not limited to the range described in the aforementioned embodiments. It is obvious to those skilled in the art that the aforementioned embodiments can be variously altered and modified. It is revealed from the claims that the technical scope of the invention includes such altered or modified modes and equivalents thereof without departing from the spirit of the invention.

It should be noted that the order of execution of the processes, such as the operations, procedure, steps, and phases, of the apparatuses, systems, programs, and methods illustrated in the claims, specification, and drawings can be implemented in any order when the order is not explicitly described as "before", "prior to", and the like or when the output from a process is used in the following process. In the claims, specification, and drawings, any operation procedure may be described using "first", "next", and the like for convenience. However, this does not mean that the operation procedure is essentially executed in this order.

What is claimed is:

1. An integrated circuit, comprising:
   a first current source having an output configured to output a first voltage;
   a second current source provided in parallel to the first current source and having an output configured to output a second voltage;
   a first resistor having two ends, one end thereof being coupled to the output of the first current source;
   a first bipolar transistor which is diode-connected and is coupled to the other end of the first resistor;
   a second bipolar transistor which is diode-connected and is coupled to the output of the second current source;
   a second resistor coupled to the second bipolar transistor, one end of the second resistor being grounded; and
   an output circuit configured to output a third voltage based on the first voltage outputted from the first current source and the second voltage outputted from the second current source.

2. The integrated circuit according to claim 1, wherein the first and second bipolar transistors are of a same size.

3. The integrated circuit according to claim 1, wherein the first and second resistors have resistance values equal to each other.

4. The integrated circuit according to claim 1, wherein the first current source includes a first metal oxide semiconductor (MOS) transistor,
   the second current source includes a second MOS transistor,
   source electrodes of the first and second MOS transistors are coupled to a power supply line, and
   gate electrodes of the first and second MOS transistors have a voltage applied to.

5. The integrated circuit according to claim 4, wherein the first and second MOS transistors are of a same size.

6. The integrated circuit according to claim 4, further comprising:
   a third bipolar transistor; and
   a bias voltage source configured to generate a bias voltage corresponding to a value of a current flowing through the third bipolar transistor, wherein
   the bias voltage source supplies the generated bias voltage to the gate electrodes of the first and second MOS transistors.

7. The integrated circuit according to claim 4, further comprising:
   a first current mirror circuit including a P-MOS transistor;
   a second current mirror circuit including an N-MOS transistor supplied with a current from the first current mirror circuit, the second current mirror circuit having a first end and a second end;
   another resistor coupled to the first end of the second current mirror circuit;
   a third bipolar transistor which is diode-connected and is coupled to the another resistor; and
   a fourth bipolar transistor which is diode-connected and is coupled to the second end of the second current mirror circuit, wherein
   a node coupling the first and second current mirror circuits is coupled to the gate electrodes of the first and second MOS transistors.

8. A semiconductor module, comprising:
   the integrated circuit according to claim 1; and
   a switching device having a control electrode, wherein
   the integrated circuit further includes a control circuit that is coupled to the control electrode of the switching device, and that controls driving of the switching device based on an input signal of the control circuit and the third voltage.

9. An integrated circuit, comprising:
   a first current source having an output configured to output a first voltage;

a second current source provided in parallel to the first current source and having an output configured to output a second voltage;
a first resistor having two ends, one end thereof being coupled to the output of the first current source;
a first bipolar transistor which is diode-connected and is coupled to the other end of the first resistor;
a second bipolar transistor which is diode-connected and is coupled to the output of the second current source;
a second resistor coupled to the second bipolar transistor; and
an output circuit configured to output a third voltage based on the first voltage outputted from the first current source and the second voltage outputted from the second current source, wherein the output circuit includes:
a third resistor having two ends, one end thereof being coupled to the output of the first current source;
a fourth resistor having two ends, one end thereof being coupled to the output of the second current source and the other end thereof being coupled to the other end of the third resistor, and
the third voltage is a voltage at a node between the third and fourth resistors.

10. The integrated circuit according to claim 9, wherein the third and fourth resistors have resistance values equal to each other.

11. An integrated circuit, comprising:
a first current source having an output configured to output a first voltage;
a second current source provided in parallel to the first current source and having an output configured to output a second voltage;
a first resistor having two ends, one end thereof being coupled to the output of the first current source;
a first bipolar transistor which is diode-connected and is coupled to the other end of the first resistor;
a second bipolar transistor which is diode-connected and is coupled to the output of the second current source;
a second resistor coupled to the second bipolar transistor;
an output circuit configured to output a third voltage based on the first voltage outputted from the first current source and the second voltage outputted from the second current source; and
a third bipolar transistor configured to generate a reference current, wherein
each of the first and second current sources generates a current using the reference current.

12. An integrated circuit, comprising:
a first current source having an output configured to output a first voltage;
a second current source provided in parallel to the first current source and having an output configured to output a second voltage;
a first resistor having two ends, one end thereof being coupled to the output of the first current source;
at least one first bipolar transistor that is diode-connected and is coupled to the other end of the first resistor;
a plurality of first trimming devices coupled to the output of the second current source;
a plurality of second bipolar transistors which are each diode-connected and are respectively coupled to the plurality of first trimming devices;
a second resistor having two ends, one end thereof being coupled to the plurality of second bipolar transistors; and
an output circuit configured to output a third voltage based on the first voltage outputted from the first current source and the second voltage outputted from the second current source.

13. The integrated circuit according to claim 12, further comprising:
a plurality of second trimming devices coupled to the other end of the first resistor, wherein
the at least one first bipolar transistor includes a plurality of first bipolar transistors, which are coupled to the other end of the first resistor respectively through the plurality of second trimming devices.

14. The integrated circuit according to claim 13, wherein at least either the plurality of first trimming devices or the plurality of second trimming devices are a plurality of first switches, and
the integrated circuit further comprises a first control circuit configured to control on/off operation of the plurality of first switches.

15. The integrated circuit according to claim 14, wherein at least one of the first resistor or the second resistor is a variable resistor, a resistance value of which is controlled by the first control circuit.

16. The integrated circuit according to claim 15, wherein the variable resistor includes a plurality of second switches, and
the first control circuit controls on/off operation of the plurality of second switches, to thereby vary the resistance value of the variable resistor.

17. The integrated circuit according to claim 14, further comprising
a memory circuit storing information representing a status of the plurality of first switches, and
the first control circuit controls the on/off operation of the plurality of first switches based on the information.

* * * * *